(12) United States Patent
Razeghi

(10) Patent No.: US 11,641,003 B2
(45) Date of Patent: May 2, 2023

(54) METHODS OF FABRICATING PLANAR INFRARED PHOTODETECTORS

(71) Applicant: Northwestern University, Evanston, IL (US)

(72) Inventor: Manijeh Razeghi, Wilmette, IL (US)

(73) Assignee: Northwestern University, Evanston, IL (US)

( * ) Notice: Subject to any disclaimer, the term of this patent is extended or adjusted under 35 U.S.C. 154(b) by 45 days.

(21) Appl. No.: 17/106,937

(22) Filed: Nov. 30, 2020

(65) Prior Publication Data

US 2021/0167244 A1    Jun. 3, 2021

Related U.S. Application Data

(60) Provisional application No. 62/942,950, filed on Dec. 3, 2019.

(51) Int. Cl.
| | | |
|---|---|---|
| *H01L 31/18* | (2006.01) | |
| *H01L 31/0304* | (2006.01) | |
| *H01L 31/0352* | (2006.01) | |
| *H01L 31/101* | (2006.01) | |
| *H01L 31/103* | (2006.01) | |
| *H01L 31/105* | (2006.01) | |

(52) U.S. Cl.
CPC .... *H01L 31/1844* (2013.01); *H01L 31/03046* (2013.01); *H01L 31/035236* (2013.01); *H01L 31/101* (2013.01); *H01L 31/105* (2013.01); *H01L 31/1035* (2013.01)

(58) Field of Classification Search
CPC ....... H01L 31/03046; H01L 31/035236; H01L 31/101; H01L 31/1035; H01L 31/105; H01L 31/1844
See application file for complete search history.

(56) References Cited

U.S. PATENT DOCUMENTS

| | | | | |
|---|---|---|---|---|
| 4,127,932 A | * | 12/1978 | Hartman | H01L 31/107 257/458 |
| 5,223,704 A | | 6/1993 | Hui et al. | |
| 5,232,867 A | * | 8/1993 | de Cremoux | H01L 21/182 438/45 |

(Continued)

FOREIGN PATENT DOCUMENTS

| | | |
|---|---|---|
| CN | 101567407 | 12/2010 |
| CN | 106558633 | 10/2017 |

OTHER PUBLICATIONS

Arash Dehzangi et al., "Demonstration of Planar Type-II Superlattice-Based Photodetectors Using Silicon Ion-Implantation," *Photonics* 2020, vol. 7, No. 68, pp. 1-8. Doi:10.3390/photonics7030068.

(Continued)

*Primary Examiner* — Ahmed N Sefer
(74) *Attorney, Agent, or Firm* — Bell & Manning, LLC

(57) ABSTRACT

Diffusion-based and ion implantation-based methods are provided for fabricating planar photodetectors. The methods may be used to fabricate planar photodetectors comprising type II superlattice absorber layers but without mesa structures. The fabricated planar photodetectors exhibit high quantum efficiencies, low dark current densities, and high specific detectivities as compared to photodetectors having mesa structures.

14 Claims, 21 Drawing Sheets

(56) References Cited

U.S. PATENT DOCUMENTS

| | | | | |
|---|---|---|---|---|
| 6,066,865 | A * | 5/2000 | Cerny | H01L 21/28587 |
| | | | | 257/E21.407 |
| 6,384,462 | B1 | 5/2002 | Pauchard et al. | |
| 7,075,165 | B2 * | 7/2006 | Leon | H01L 31/1812 |
| | | | | 257/458 |
| 7,348,608 | B2 | 3/2008 | Ko et al. | |
| 9,818,896 | B1 * | 11/2017 | de Lyon | H01L 31/1844 |
| 2002/0158268 | A1 * | 10/2002 | Matsuda | H01L 31/02162 |
| | | | | 257/184 |
| 2005/0056862 | A1 * | 3/2005 | Park | H01L 31/105 |
| | | | | 257/E27.129 |
| 2006/0060932 | A1 * | 3/2006 | Rafferty | H01L 31/03529 |
| | | | | 257/434 |
| 2007/0246701 | A1 * | 10/2007 | Yanson | H01L 21/182 |
| | | | | 438/45 |
| 2009/0045395 | A1 * | 2/2009 | Kim | H01L 27/1464 |
| | | | | 257/18 |
| 2011/0001165 | A1 * | 1/2011 | Smith | H01L 31/022408 |
| | | | | 438/94 |
| 2011/0291158 | A1 * | 12/2011 | Ogura | H01L 31/03046 |
| | | | | 257/187 |
| 2013/0020666 | A1 * | 1/2013 | Smith | H01L 27/14667 |
| | | | | 257/E31.093 |
| 2014/0175585 | A1 * | 6/2014 | Iguchi | H01L 31/105 |
| | | | | 257/431 |
| 2014/0197373 | A1 * | 7/2014 | Iguchi | H01L 31/109 |
| | | | | 438/39 |
| 2017/0084764 | A1 * | 3/2017 | Lu | H01L 27/1446 |
| 2018/0019269 | A1 * | 1/2018 | Klipstein | H01L 27/1446 |
| 2018/0294301 | A1 * | 10/2018 | Wei | H01L 27/14678 |
| 2019/0019899 | A1 * | 1/2019 | Wang | H01L 31/02 |
| 2021/0305307 | A1 * | 9/2021 | Huang | H01L 27/14692 |

OTHER PUBLICATIONS

Arash Dehzangi et al., "Planar nBn type-II superlattice mid-wavelength infrared photodetectors using zinc ion-implantation," *Appl. Phys. Lett.* (2020), vol. 116, 221103-1-221103-5. Doi: 10.1063/5.0010273.

Wu et al., "High performance Zn-diffused planar mid-wavelength infrared type-II InAs/InAs1-xSbx superlattice photodetector by MOCVD," *Appl. Phys. Lett.* (2020), vol. 116, 161108-1-1161108-4. Doi: 10.1063/5.0005326.

* cited by examiner

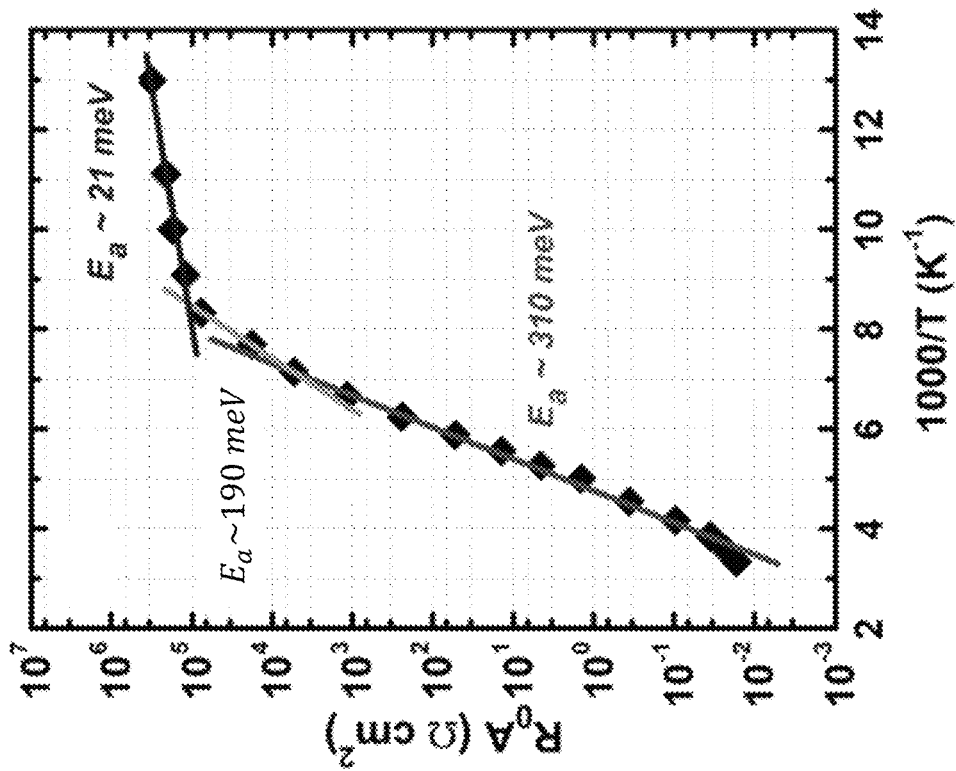
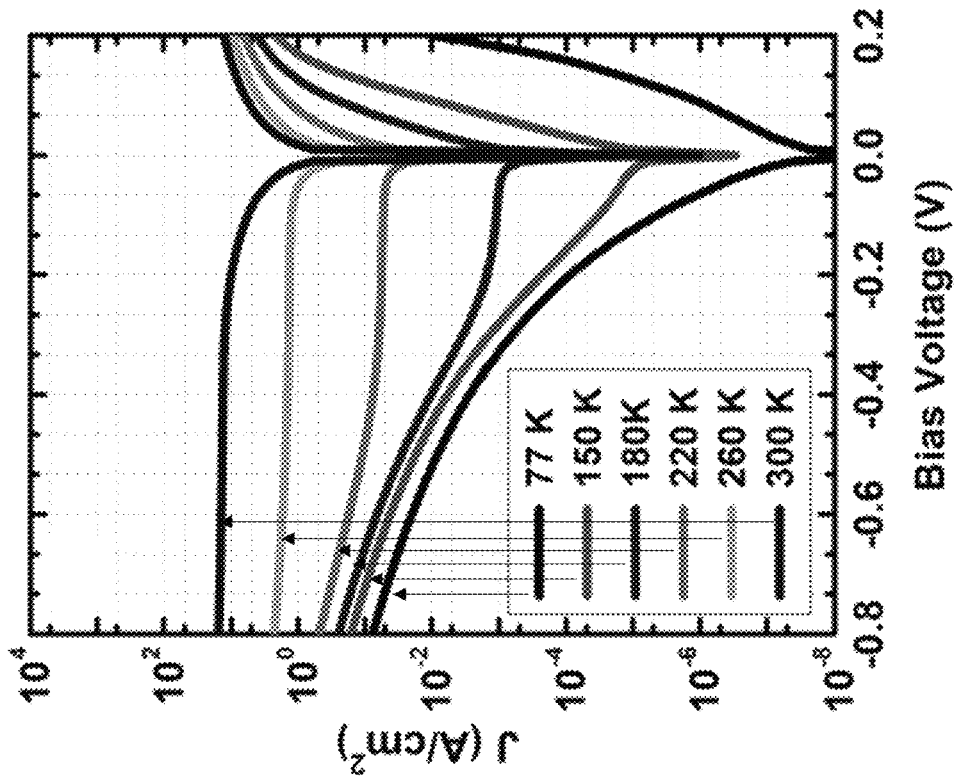
FIG. 7A
FIG. 7B

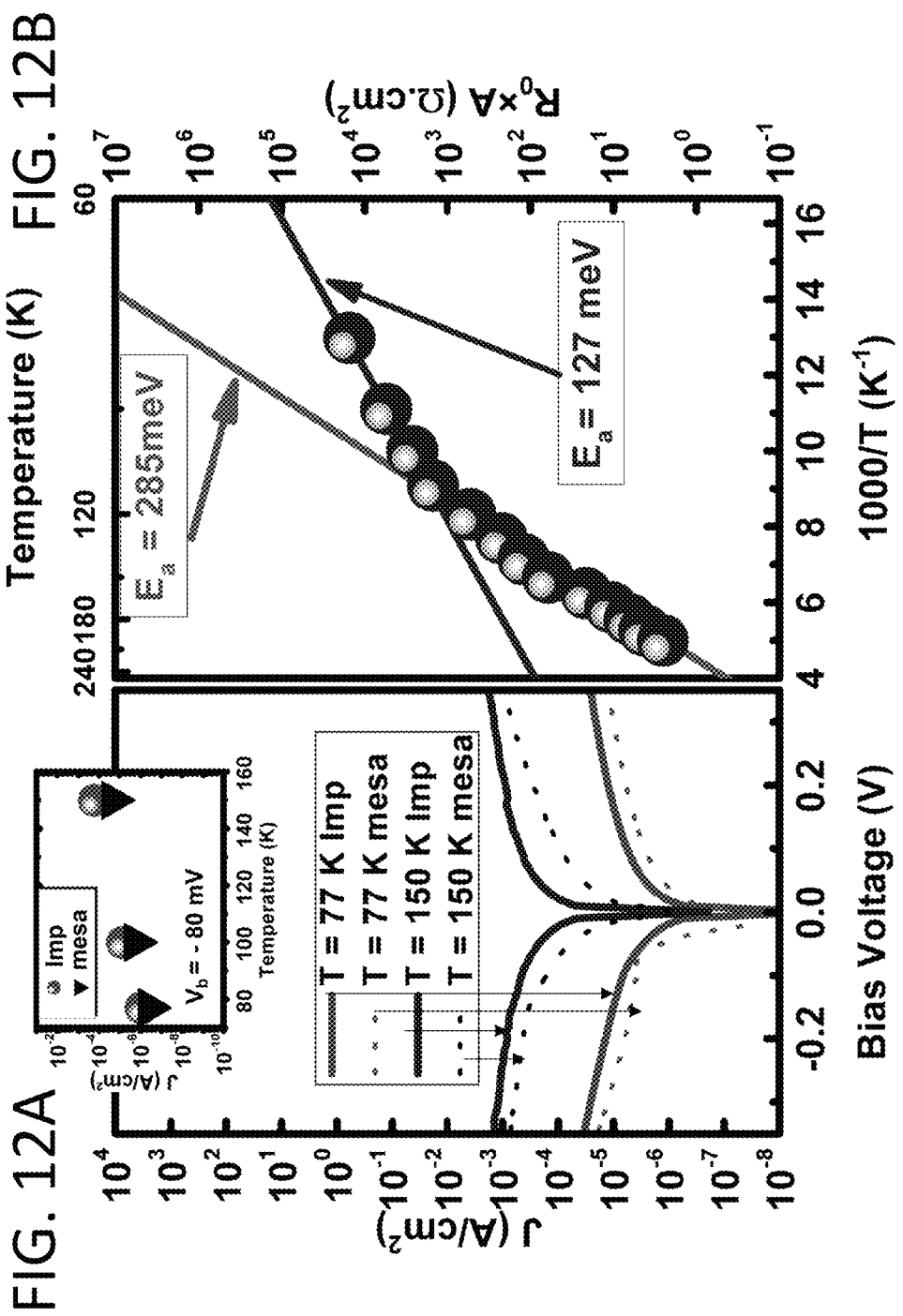

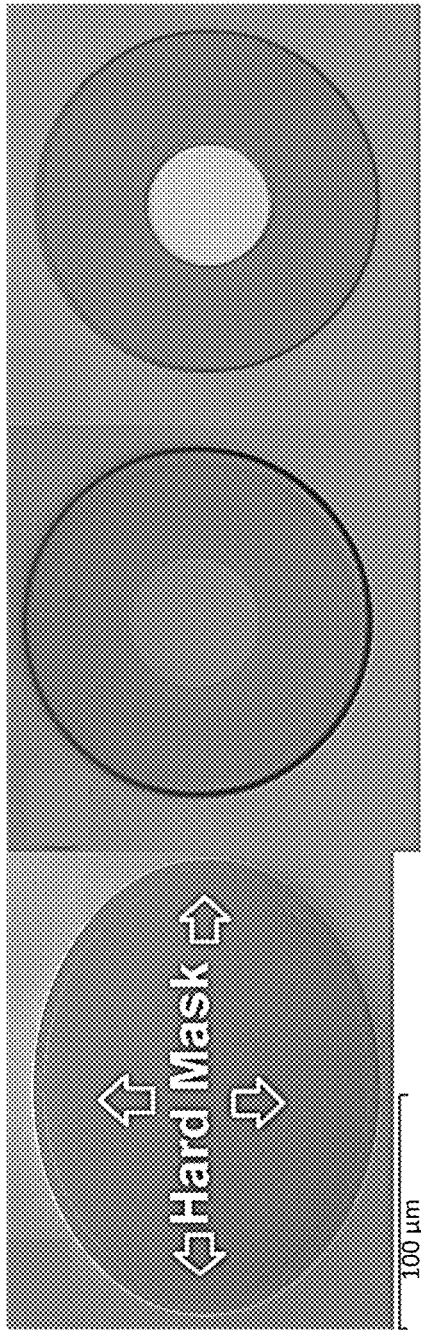
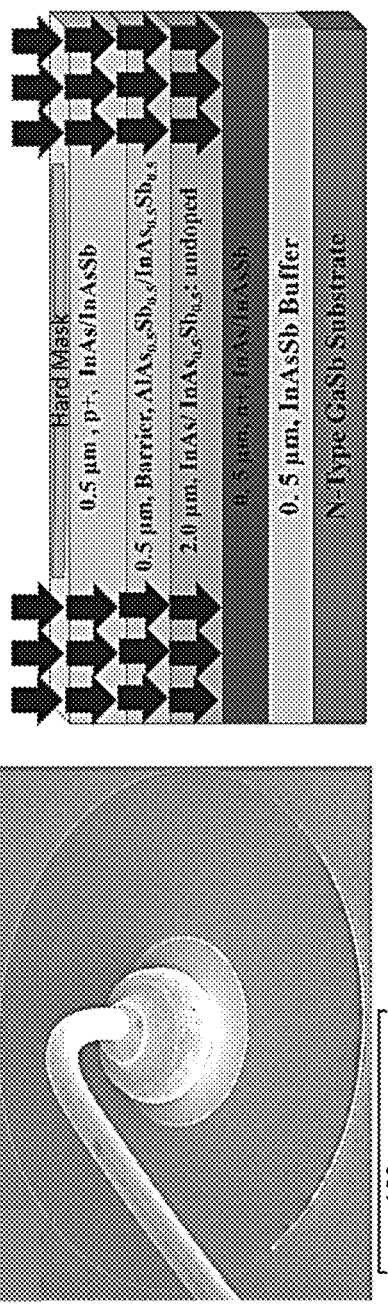
FIG. 16A  FIG. 16B  FIG. 16C  FIG. 16D  FIG. 16E

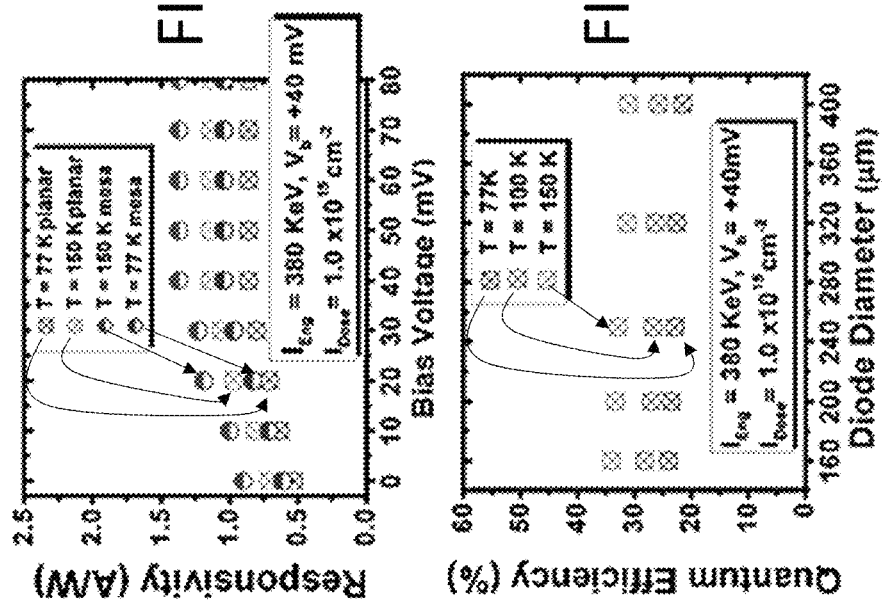
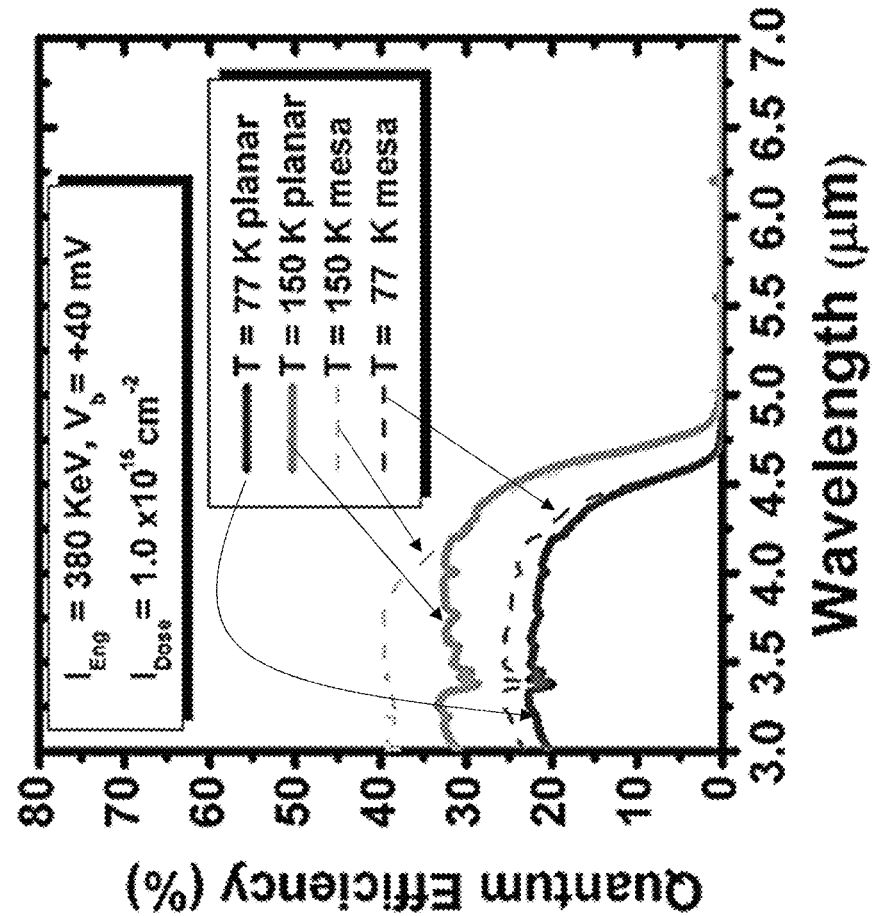
FIG. 19B
FIG. 19C
FIG. 19A

METHODS OF FABRICATING PLANAR INFRARED PHOTODETECTORS

CROSS-REFERENCE TO RELATED APPLICATIONS

The present application claims the priority benefit of U.S. Provisional Patent App. No. 62/942,950 filed on Dec. 3, 2019, the entire disclosure of which is incorporated by reference herein.

REFERENCE TO GOVERNMENT RIGHTS

This invention was made with government support under W911NF-16-1-0410 awarded by the Defense Advanced Research Projects Agency. The government has certain rights in the invention.

BACKGROUND

High performance mid-wavelength and long-wavelength infrared (MWIR-LWIR) heterostructure photodetectors are of great interest for applications in medicine, pharmaceuticals, astronomy, as well as for other military and commercial applications. During the last decade, significant development has been made in the design and performance of MWIR and LWIR heterostructure photodetectors using HgCdTe, Sb-based III-V ternary alloys, and type-II superlattice (T2SL) material systems. Of these, the T2SL material system is a relatively new material that is rapidly maturing and becoming a strong alternative for infrared detection. The major advantages of T2SL materials are high flexibility in bandgap engineering for different applications, easy manufacturability, high yield, good uniformity, and suppressed auger recombination. Most T2SL-based devices are formed as mesa structures, in which p-n junctions grown epitaxially are then etched to define the mesa structures. Such devices have drawbacks due to an abrupt termination of the periodic lattices caused by etching. This results in the formation of dangling chemical bonds at the semiconductor-air interfaces and pinning of the Fermi level, which may promote the formation of leakage pathways.

SUMMARY

The present disclosure provides methods for fabricating planar photodetectors, including type-II superlattice (T2SL) planar photodetectors. The methods do not require or involve etching to provide mesas, and thus, avoid reducing surface leakage current. Embodiments of the disclosed methods involve either diffusion or ion implantation. Neither of these techniques have been used to form existing T2SL photodetectors as the fine and sensitive structure of superlattice materials renders them highly susceptible to damage by both diffusion and ion implantation.

Diffusion-based methods for fabricating a planar photodetector are provided. Embodiments comprise removing a portion of a protection layer formed on a surface of an n-type or a p-type absorber layer comprising a semiconductor to define a diffusion window in the protection layer through which a portion of the absorber layer is exposed; and exposing the portion of the absorber layer to a dopant source comprising a dopant of opposite type to the absorber layer under conditions such that the dopant diffuses into the absorber layer to form a diffused region comprising the dopant of the opposite type within the absorber layer.

Ion implantation-based methods for fabricating a planar photodetector are also provided. Embodiments comprise removing a portion of a protection layer formed on a surface of a semiconductor heterostructure comprising an n-type or a p-type top contact layer, a barrier layer under the top contact layer, and an absorber layer under the barrier layer, to define an implantation window in the protection layer through which a portion of the surface of the semiconductor heterostructure is exposed; and exposing the portion of the surface of the semiconductor heterostructure to a flux of ions under conditions such that the ions implant into the semiconductor heterostructure to form an isolation region comprising the implanted ions within the semiconductor heterostructure and surrounding an unexposed portion of the semiconductor heterostructure.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIG. 7A is a plot of dark current density vs applied bias voltage characteristics of the photodetector of FIG. 5A at different temperatures. FIG. 7B is a plot of $R_0A$ vs 1/T from 77 to 300 K.

FIG. 10A is an optical microscope image of the sample after implantation, with top metal contact and Sift hard mask. FIG. 10B is an optical microscope image after window opening for the top metal contact. FIG. 10C is a scanning electron microscope (SEM) image after window opening for top metal contact, ready for wire bonding and testing.

FIG. 12A shows dark current density (J) vs. applied bias voltage ($V_b$) for the optimized planar photodetector ($E_{imp}$=300 KeV, dose=$1.0 \times 10^{15}$ cm$^{-2}$) fabricated according to an illustrative embodiment of the present methods and comparative mesa etched photodetectors at 77, and 150 K. FIG. 12B shows an Arrhenius plot of the resistance-area product $R_0 \times A$. All diodes were circular with a 160 μm diameter.

FIGS. 16A-16D show images of a planar T2SL photodetector at different processing steps using an illustrative embodiment of the present methods. FIG. 16A is a scanning electron microscope (SEM) image and FIG. 16B is an optical micrograph of a circular diode covered by hard mask, ready for implantation. FIG. 16C is an optical micrograph after window opening to the top metal contact. FIG. 16D is an SEM image after wire bonding, ready for test. FIG. 16E shows a schematic diagram of the device structure. The arrows show the area of ion-implantation to isolate adjacent diodes.

FIG. 19A shows saturated 77 K and 150 K quantum efficiency (QE) spectra of the 200 μm diameter optimized planar device (present methods) compared to a comparative mesa-isolated device. The 100% cut-off wavelength is 4.6 μm at 77K and increases to 4.9 μm at 150K. FIG. 19B shows responsivity vs bias voltage showing saturation at +40 mV. FIG. 19C shows QE vs. diameter showing no size dependence.

DETAILED DESCRIPTION

Figure 1:
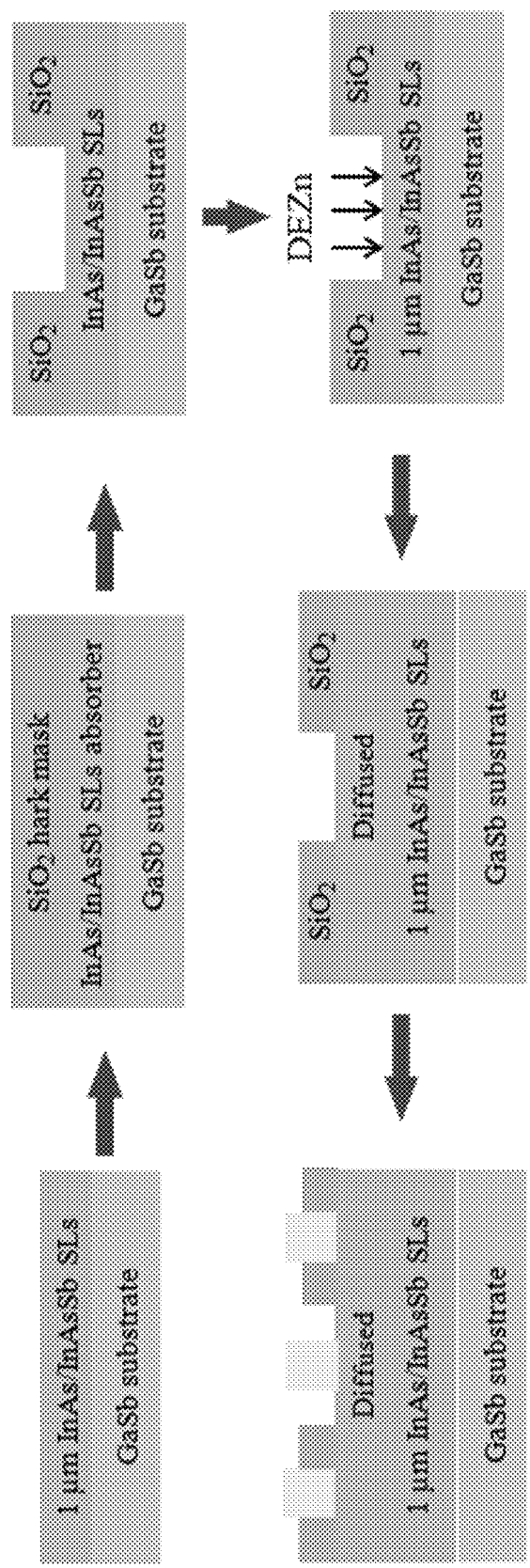
FIG. 1 shows a schematic diagram of a method for fabricating a planar photodetector according to an illustrative embodiment.

The present disclosure provides methods for fabricating planar photodetectors, including type-II superlattice (T2SL) planar photodetectors. As used herein, the phrase "planar photodetector" and the like is distinguished from photodetectors having mesa structure(s). Cross-sections of the two types of photodetectors may be used to readily distinguish between the two. A cross-section perpendicular to the semiconductor layers of a photodetector having a mesa structure will show termination of periodic lattices across its p-n junction. This termination runs approximately perpendicular to the semiconductor layers due to etching. A cross-section perpendicular to the semiconductor layers of a planar photodetector will not show such termination since the p-n junctions are not etched.

Diffusion-based methods for fabricating planar photodetectors are provided. An embodiment of such a method comprises removing a portion of a protection layer formed on (e.g., directly on) a surface of an n-type or a p-type absorber layer comprising a semiconductor to define a diffusion window in the protection layer through which a corresponding portion of the absorber layer is exposed. The method further comprises exposing the corresponding portion of the absorber layer to a dopant source comprising a dopant of opposite type to the absorber layer under conditions such that the dopant diffuses into the absorber layer to form a diffused region comprising the dopant of the opposite type within the absorber layer. Thus, if the absorber layer is n-type, the dopant is p-type to form a p-type diffusion region. If the absorber layer is p-type, the dopant is n-type to form an n-type diffusion region. The method may further comprise forming the n-type or p-type absorber layer comprising the semiconductor on (e.g., directly on) a substrate and forming the protection layer on (e.g., directly on) the absorber layer.

A variety of semiconductors may be used for the absorber layer and the substrate, which are generally lattice-matched or strain-balanced to one another. In embodiments, the absorber layer is composed of bulk semiconductor. In embodiments, the absorber layer is composed of a superlattice semiconductor. This means that the absorber layer is in the form of periodically alternating ultrathin (e.g., less than 50 nm, less than 20 nm, less than 10 nm) sublayers of two or more different types of semiconductors. In embodiments, the absorber layer is a type II superlattice, wherein type II refers to the type of electronic miniband structure defined therein. In embodiments, the type II superlattice is an InAs/GaSb type II superlattice. In embodiments, the type II superlattice is an InAs/InAs$_{1-x}$Sb$_x$ type II superlattice (x may vary, e.g., from 0.1 to 0.9). As noted above, subjecting such type II superlattices to either diffusion or ion implantation has been avoided in existing methods so as not to damage the ultrathin sublayers and negatively affect the electronic miniband structures. The absorber layer is either n-type or p-type. The absorber layer may have any thickness desired for the particular application, e.g., from 1 μm to 5 μm.

The absorber layer may be formed on the substrate using various epitaxial growth techniques such as metalorganic chemical vapor deposition (MOCVD) or molecular beam epitaxy (MBE). Known reactor systems and conditions may be used to form the absorber layer using such techniques.

The material and thickness of the protection layer formed on the absorber layer are generally selected to protect desired portions of the underlying absorber layer from being exposed to the dopant source used during subsequent steps of the diffusion-based method. Dielectric materials may be used for the protection layer such as $SiO_2$ (others may be used such as $Si_3N_4$). Illustrative thicknesses are e.g., from 1 μm to 5 μm. A variety of thin film deposition techniques may be used to form the protection layer, including plasma enhanced chemical vapor deposition (PECVD).

A portion of the formed protection layer is removed to define the diffusion window therein. The lateral dimensions (i.e., width/length as measured within the plane of the protection layer) of the diffusion window are selected depending upon the desired lateral dimensions for the diffusion region to be created within the absorber layer. Other portion(s) of the protection layer are not removed so as to protect the absorber layer directly underneath these other portion(s). Various etching techniques such as reactive ion etching (RIE), inductively coupled plasma etching (ICP), and wet etching may be used for removing the desired portion of the protection layer.

Creation of the diffusion window in the protection layer exposes a corresponding portion of the absorber layer. This portion of the absorber layer is exposed to the dopant source comprising the dopant of opposite type. Various dopant sources may be used, depending upon the semiconductor(s) selected for the absorber layer. An illustrative p-type dopant source is diethylzinc to provide Zn as an p-type dopant (others may be used such as Be, Mg or C). An illustrative n-type dopant source is $SiH_4$ to provide Si as an n-type dopant (others may be used such as Se, S, Sn, or Te). Exposure to the dopant source may be carried out using MOCVD or a similar technique under conditions to allow the dopant to diffuse into the absorber layer. These conditions include parameters such as the pressure of vapor over the absorber layer (e.g., 50 to 60 Torr), the temperature (e.g., 350° C. to 500° C.), the flow rate of the dopant source (e.g., 5 to 20 μmol/min), and the period of time (e.g., 5 to 30 minutes). A carrier gas (e.g., $H_2$, $N_2$, etc.) may be used to deliver the dopant source. A source(s) used to form the absorber layer may be included in the vapor to prevent decomposition of the absorber layer during diffusion. These conditions may be adjusted to achieve a desired diffusion depth (measured perpendicular to the plane of the absorber layer), dopant concentrations into the absorber layer, as well as desired performance characteristics (e.g., quantum efficiencies, dark current densities, and specific detectivities). Illustrative diffusion depths include, e.g., from 50 nm to 500 nm, from 50 nm to 250 nm, from 100 nm to 200 nm. The diffusion depth may be such that the diffusion region extends from the surface of the absorber layer and partially through the absorber layer. By partially, it is meant that the diffusion region does not extend all the way through the absorber layer. Illustrative dopant concentrations include, e.g., $10^{17}$ $cm^{-3}$ to $10^{20}$ $cm^{-3}$, $10^{17}$ $cm^{-3}$ to $10^{19}$ $cm^{-3}$, $10^{17}$ $cm^{-3}$ to $10^{18}$ $cm^{-3}$.

The diffusion-based method may further comprise forming other layers of the planar photodetector before or after the steps described above. Other layers include, e.g., one or more buffer layers such as a buffer layer between the substrate and the absorber layer (e.g., directly in between and in contact with both); one or more conductive contacts on (e.g., directly on) the diffusion region; and one or more conductive contacts on (e.g., directly on) and the absorber layer. Illustrative such conductive contacts are shown in the planar photodetectors of FIGS. 2 and 5. The conductive contacts are composed of a conductive material, e.g., a metal. They may be formed using various thin film deposition techniques, e.g., electron beam deposition. However, in embodiments, no intervening layer is present between the absorber layer and the diffusion region. In embodiments, no intervening layer is present between the absorber layer and a conductive contact (other than the diffusion region) on or above the absorber layer. In embodiments, the diffusion region is formed only within the absorber layer and no other layer of the planar photodetector. This excludes the use of certain contact layers and passivation layers that have been used in existing planar photodetectors.

The diffusion-based methods may be used to fabricate high-quality planar photodetectors, including planar photodetectors exhibiting the high quantum efficiencies, low dark current densities, and high specific detectivities as described in the Examples below. The planar photodetectors fabricated using the diffusion-based methods are also encompassed by the present disclosure.

Figure 2:
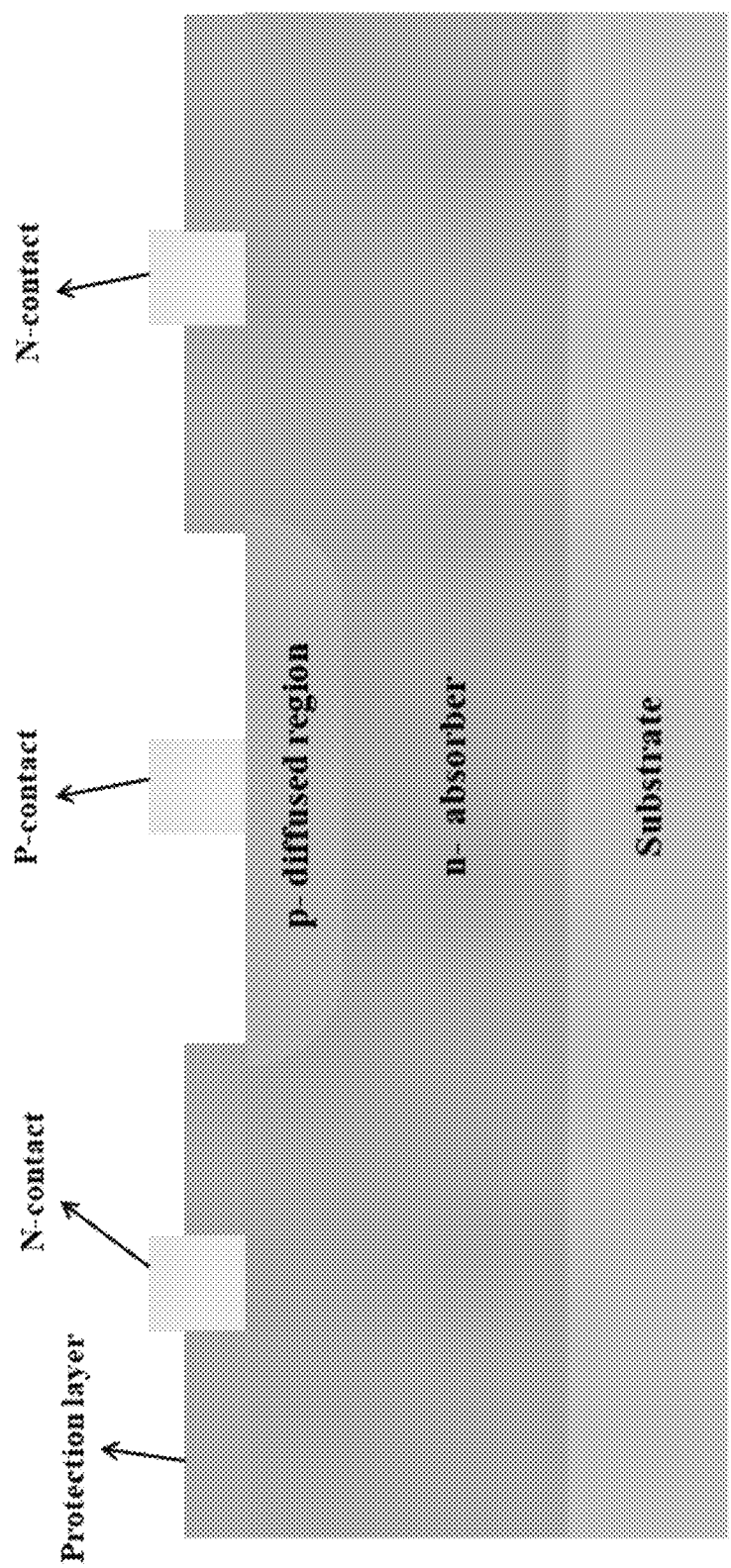
FIG. 2 shows a schematic of an illustrative planar photodetector made using the method of FIG. 1.

FIG. 1 is a schematic illustration of a diffusion-based method for fabricating a planar photodetector, such as that shown in FIG. 2. FIG. 5 shows another illustrative planar photodetector fabricated via an illustrative diffusion-based method. Examples 1 and 2, below, provide additional details regarding these diffusion-based methods and the resulting planar photodetectors.

Ion implantation-based methods for fabricating planar photodetectors are also provided. An embodiment of such a method comprises removing a portion of a protection layer formed on (e.g., directly on) a surface of a semiconductor heterostructure comprising a n-type or p-type top contact layer, a barrier layer under (e.g., directly under) the top contact layer, and an n-type absorber layer under (e.g., directly under) the barrier layer, to define an implantation window in the protection layer through which a corresponding portion of the surface of the semiconductor heterostructure is exposed. The method further comprises exposing the corresponding portion of the surface of the semiconductor heterostructure to a flux of ions under conditions such that the ions implant into the semiconductor heterostructure to form an isolation region comprising the implanted ions within the semiconductor heterostructure and surrounding an unexposed portion of the semiconductor heterostructure. The method may further comprise forming the layers of the semiconductor heterostructure on (e.g., directly on) a substrate and forming the protection layer on (e.g., directly on) the surface of the semiconductor heterostructure.

A variety of semiconductors may be used for the layers of the semiconductor heterostructure, including the top contact layer, the barrier layer, and the absorber layer, as well as the substrate, which are generally lattice-matched or strain-balanced to one another. In embodiments, the absorber layer is composed of a superlattice semiconductor as described above, including a type II superlattice such as an InAs/GaSb or an $InAs/InAs_{1-x}Sb_x$ type II superlattice. As noted above, subjecting such type II superlattices to either diffusion or ion implantation has been avoided in existing methods so as not to damage the ultrathin sublayers and negatively affect the electronic miniband structures. The absorber layer may have any thickness desired for the particular application, e.g., from 1 µm to 5 µm. The top contact layer, the barrier layer, or both, may also be composed of such superlattice semiconductors, with compositions and thicknesses selected so that these layers perform their intended functions in nBn or pBn type photodetectors. The semiconductor heterostructure may further comprise a bottom contact layer under (e.g., directly under) the absorber layer. Again, this bottom contact layer may be composed of the superlattice semiconductors disclosed herein.

The layers of the semiconductor heterostructure may be formed on the substrate using various epitaxial growth techniques such as metalorganic chemical vapor deposition (MOCVD) or molecular beam epitaxy (MBE). Known reactor systems and conditions may be used to form the layers using such techniques.

The material and thickness of the protection layer formed on the surface of the surface of the semiconductor heterostructure are generally selected to protect desired portions of the underlying semiconductor heterostructure from being exposed to the ion source used during subsequent steps of the implantation-based method. Dielectric materials and illustrative thickness as described above may be used. Thin film deposition techniques such as PECVD may be used to form the protection layer.

A portion of the formed protection layer is removed to define the implantation window therein. The lateral dimensions (i.e., width/length as measured within the plane of the protection layer) of the implantation window are selected depending upon the desired lateral dimensions for the isolation region to be created within the semiconductor heterostructure. Other portion(s) of the protection layer are not removed so as to protect the semiconductor heterostructure directly underneath these other portion(s). These protected portion(s) of the semiconductor heterostructure may be referred to as the "unexposed portion(s)" as this phrase has been used above. Various etching techniques as described above may be used for removing the desired portion of the protection layer.

Creation of the implantation window in the protection layer exposes a corresponding portion of the semiconductor heterostructure. This corresponding portion of the semiconductor heterostructure is exposed to the flux of ions. Various ions may be used, depending upon the semiconductors selected for the semiconductor heterostructure. An illustrative p-type ion to provide an isolation region for an nBn-type photodetector is Zn (others may be used). An illustrative n-type ion to provide an isolation region for a pBn-type photodetector is Si (others may be used). Exposure to the flux of ions may be carried out using various ion implantation systems under conditions to allow the ions to implant into the semiconductor structure. These conditions include parameters such as the implantation energy (e.g., 90 to 400 KeV), implantation dose (e.g., $10^{12}$ to $10^{15}$ $cm^{-2}$), substrate tilt (e.g., 1° to 10°), and substrate cooling (e.g., none). These conditions may be adjusted to achieve a desired implantation depth (measured perpendicular to the plane of the semiconductor heterostructure) as well as desired performance characteristics (e.g., quantum efficiencies, dark current densities, and specific detectivities). Illustrative implantation depths include, e.g., from 500 nm to 1200 nm, from 650 nm to 1100 nm, or from 800 nm to 1000 nm. The implantation depth may be such that the isolation region extends from the surface of the semiconductor structure, through the n-type or p-type contact layer, through the barrier layer, and partially through the absorber layer. By partially, it is meant that the isolation region does not extend all the way through the absorber layer.

Figures 10A, 10B, 10C:
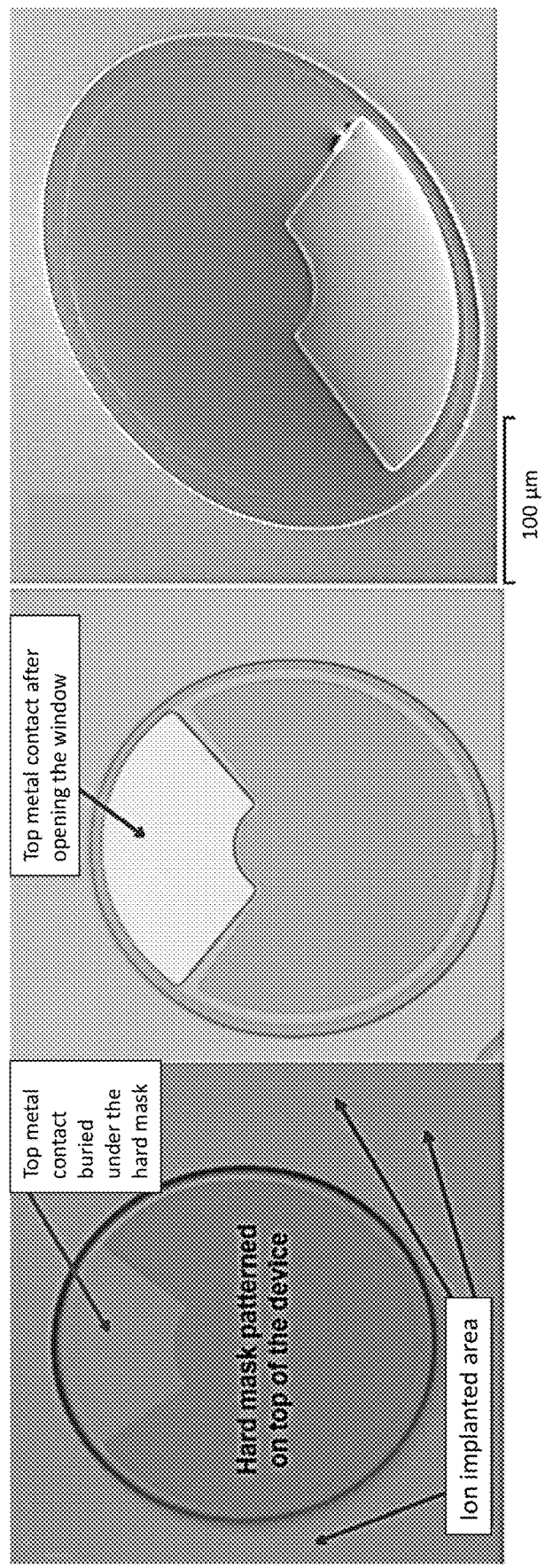
FIGS. 10A-10C show images of planar T2SL photodetectors at different steps in another illustrative embodiment of the present methods.

The implantation-based method may further comprise forming other layers of the planar photodetector before or after the steps described above. Other layers include, e.g., one or more buffer layers such as a buffer layer between the substrate and the bottom contact layer (e.g., directly in between and in contact with both); and one or more conductive contacts on (e.g., directly on) the unexposed portion of the semiconductor heterostructure region. Illustrative such buffer layers are shown in the planar photodetector of FIG. 16E and illustrative such conductive contacts are shown in the planar photodetector of FIG. 16D and the planar photodetector of FIGS. 10B-10C. The conductive contacts are composed of a conductive material, e.g., a metal. They may be formed using various thin film deposition techniques as described above.

The implantation-based method may further comprise annealing the planar photodetector at a temperature (e.g., from 100 to 500° C.) for a period of time (e.g., from 1 second to 1 minute). In other embodiments, the planar photodetector is not subjected to annealing.

The implantation-based methods may be used to fabricate high-quality planar photodetectors, including planar photodetectors exhibiting the high quantum efficiencies, low dark current densities, and high specific detectivities as described in the Examples below. The planar photodetectors fabricated using the implantation-based methods are also encompassed by the present disclosure.

Examples 3 and 4, below, provide additional details regarding the implantation-based methods and the resulting planar photodetectors.

Any of the methods disclosed herein may be used to provide planar photodetectors consisting of, in any combination, the layers described herein. The methods may also be used to provide an array of planar photodetectors, each formed and characterized as described herein. By way of illustration, an array of planar photodetectors may comprise a plurality of planar photodetectors formed via a disclosed embodiment of the implantation-based methods, wherein each planar photodetector is isolated from adjacent photodetectors by an isolation region surrounding the planar photodetector.

EXAMPLES

Example 1

First, 200 periods of strain balanced 9/10 mono-layers (MLs) InAs/InAs$_{0.8}$Sb$_{0.2}$ superlattice (SL) were grown on an n-type GaSb substrate by MOCVD. Trimethylindium (TMIn), triethylgallium (TEGa), and tritertiarybutylaluminium (TTBAl) were used as group III precursors. Trimethylantimony (TMSb), pure AsH$_3$, and 2% dilute AsH$_3$ were used as group V precursors. After growth of the superlattice, a 1 µm SiO$_2$ protection layer was deposited on the surface of the epitaxial wafer using PECVD. Standard lithographic and reactive ion etching (RIE) (or ICP, or wet etching) techniques were used to selectively etch away a portion of the SiO$_2$ protection layer to form a diffusion window. Next, the sample was put into a MOCVD reactor for diffusion using DEZn (diethylzinc) under AsH$_3$ atmosphere to form a p-type diffused region. (Alternatively, to form an an-type diffused region on a p-type absorber, the diffusion may be carried out using SiH$_4$ under AsH$_3$ atmosphere.) Next, standard lithographic and reactive ion etching (RIE) (or ICP, or wet etching) techniques were used to selective etch away the SiO$_2$ protection layer to provide the ohmic contacts. Finally, n-type and p-type electrodes were deposited by electron beam evaporation. The process is illustrated in FIG. 1 and the planar infrared photodetector formed is shown in FIG. 2.

Figure 3:
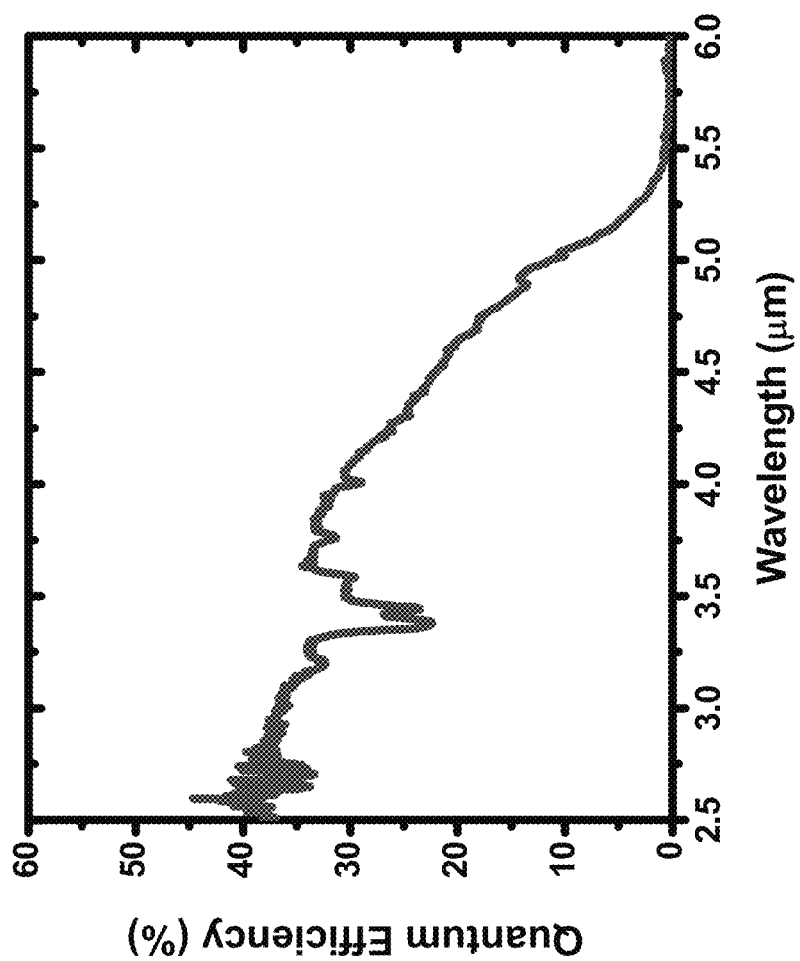
FIG. 3 shows a quantum efficiency spectrum of the planar photodetector of FIG. 2.
Figure 4A:
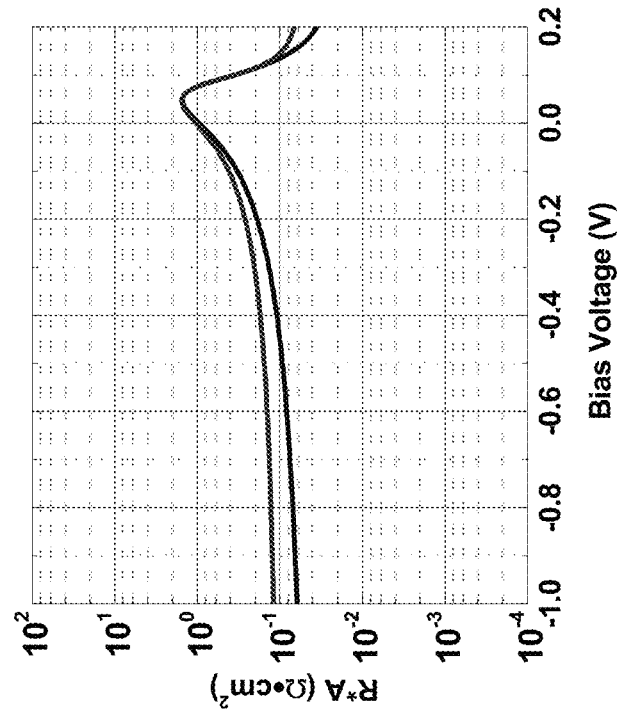
FIG. 4A shows a plot of dark current density vs applied bias voltage characteristic of the planar photodetector of FIG. 2.
Figure 4B:
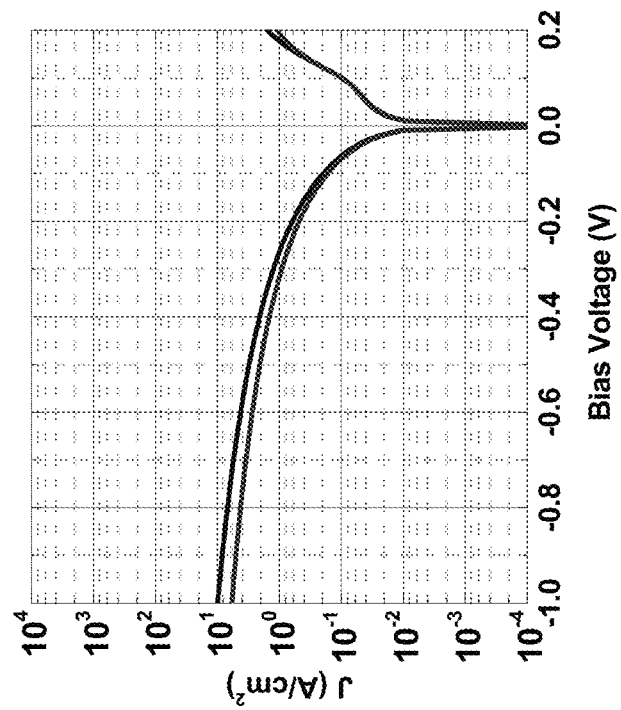
FIG. 4B shows a plot of differential-resistance area product vs applied bias voltage characteristic of the planar photodetector of FIG. 2.

The electrical and optical performance of the planar infrared photodetector was performed. The optical characterization was done under front-side illumination without any anti-reflection (AR) coating applied to the device. FIG. 3 shows the optical characterization result, which was measured at 150 K. The device shows zero bias dependence performance and has a 50% cutoff wavelength at 5.0 μm. At the peak responsivity of 3.8 μm, an external quantum efficiency (QE) of 33% and a responsivity of 1.03 A/W were obtained. FIG. 4A shows the dark current density versus applied bias voltage characteristics of the device at 150 K. The device exhibits a dark current density of $2.4 \times 10^{-2}$ A/cm² at −20 mV bias. FIG. 4B shows a plot of differential-resistance area product vs applied bias voltage characteristic of the device.

Example 2

This Example discloses fabrication of a Zn-diffused planar mid-wavelength infrared type-II InAs/InAs$_{1-x}$Sb$_x$ superlattice photodetector. Both the superlattice growth and Zn diffusion were performed in a MOCVD system.

The diffusion sample consisting of 1 μm unintentional doped InAs/InAs$_{1-x}$Sb$_x$ type-II superlattice (T2SL) was grown on the Te-doped n-type ($10^{17}$ cm$^{-3}$) GaSb substrate by MOCVD. In this work, the superlattice design is 10/12 monolayers (MLs) of InAs/InAs$_{0.8}$Sb$_{0.2}$ per period, which has a theoretical cutoff wavelength around 5.0 μm at 150 K. The electrical properties of InAs/InAs$_{1-x}$Sb$_x$ T2SL were evaluated by the Hall measurement on the same structure grown on the semi-insulating GaAs substrate. At 300 K, the intrinsic concentration and mobility of the as-grown unintentional doped InAs/InAs$_{1-x}$Sb$_x$ T2SL on the GaAs substrate are $1.6 \times 10^{17}$ cm$^{-3}$ and 13,900 cm²/V s, respectively.

Figure 5A:
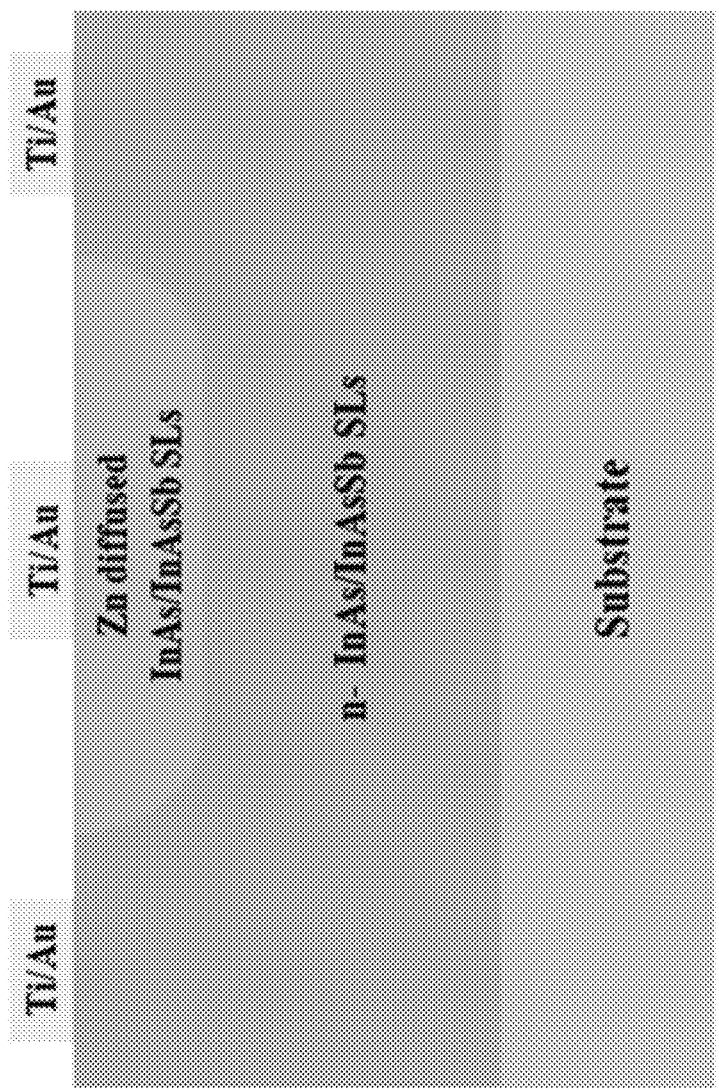
FIG. 5A shows a schematic structure of a planar photodetector fabricated according to an illustrative embodiment of the present methods.
Figure 5B:
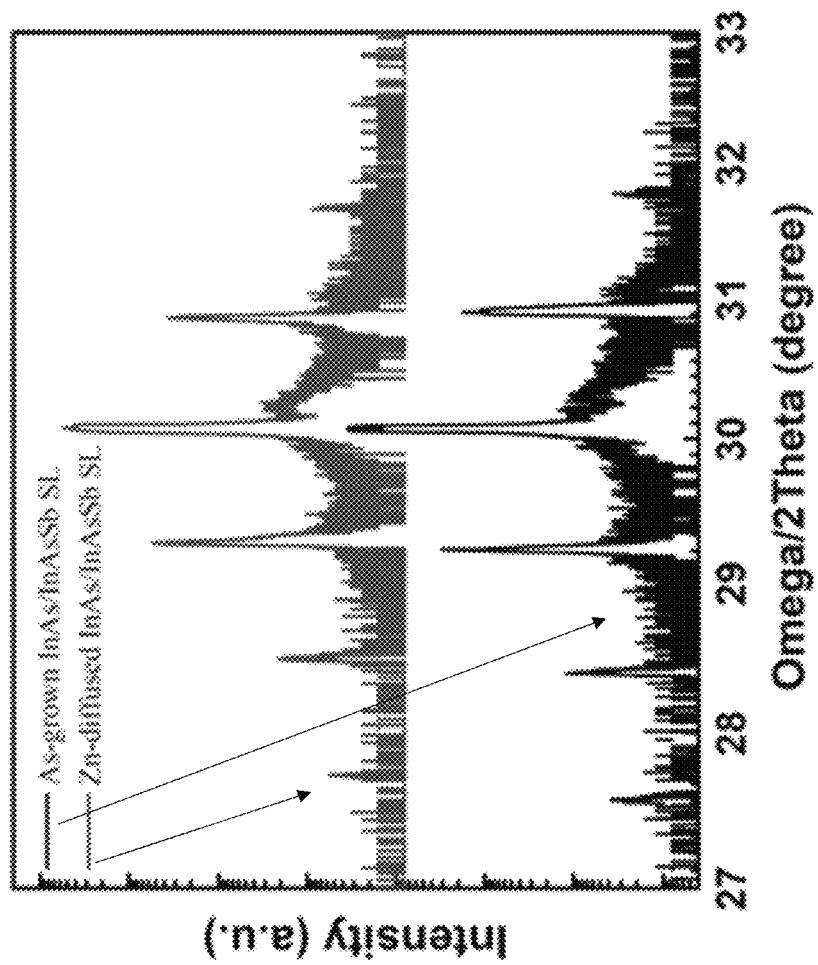
FIG. 5B shows a high-resolution x-ray diffraction (HR-XRD) curve of the as-grown and Zn diffused $InAs/InAs_{1-x}Sb_x$ superlattices of FIG. 5A.

FIG. 5A shows the schematic of the diffused planar device structure. For the planar device fabrication, 1-μm-thick silicon oxide (SiO$_2$) was deposited using plasma enhanced chemical vapor deposition (PECVD) for the protection layer. The diffusion window was opened by using CF$_4$:Ar$^+$ plasma in an electron cyclotron resonance reactive ion etching (ECR-RIE) system to remove SiO$_2$. The Zn diffusion process was performed in an EMCORE MOCVD reactor employing diethylzinc (DEZn) as the Zn source. AsH$_3$ was introduced as an As source to suppress As escape from the top InAs layer. Hydrogen was used as the carrier gas. The reactor pressure and the diffusion temperature were kept consistent with the InAs/InAs$_{1-x}$Sb$_x$ T2SL growth, which were 60 Torr and 430° C., respectively. The nominal DEZn molar flow rate was 15 μmol/min, and the diffusion time was 15 min. High resolution x-ray diffraction was used to characterize the material quality before and after the diffusion process as shown in FIG. 5B. The diffused sample did not show observable quality deterioration. After the diffusion process, p- and n-contacts were formed using electron beam deposited Ti/Au (400/1200 Å). After the processing, the devices were wire-bonded onto chip carriers and loaded into a cryostat for electrical and optical measurements. No anti-reflection (AR) coating was applied to the devices.

Figure 6B:
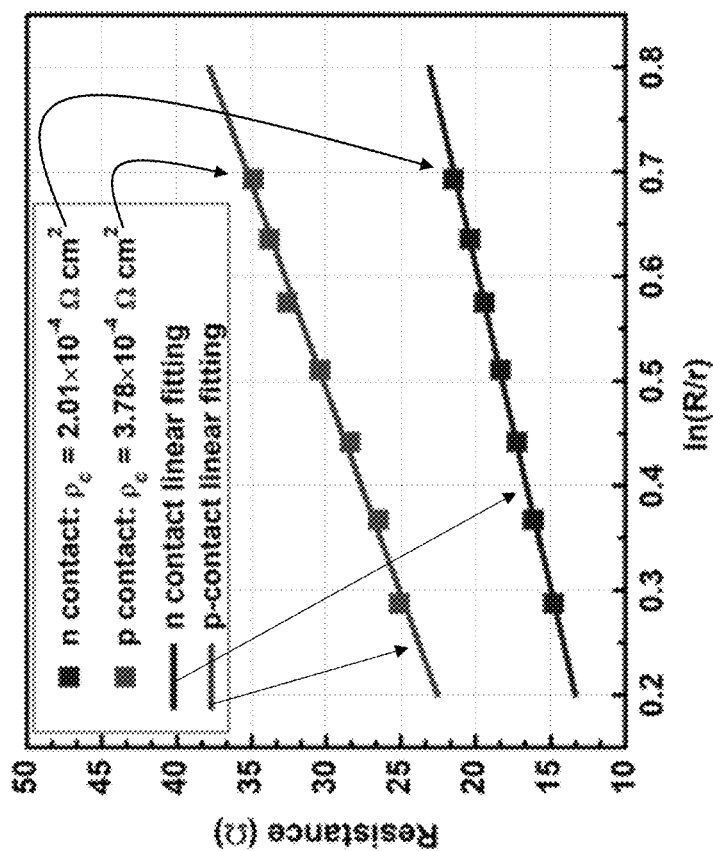
FIG. 6B shows the measured resistance dependence on ln(R/r) of the circular transmission line model (CTLM) patterns on intrinsic and Zn-diffused $InAs/InAs_{1-x}Sb_x$ superlattices of the photodetector of FIG. 5A.
Figure 6A:
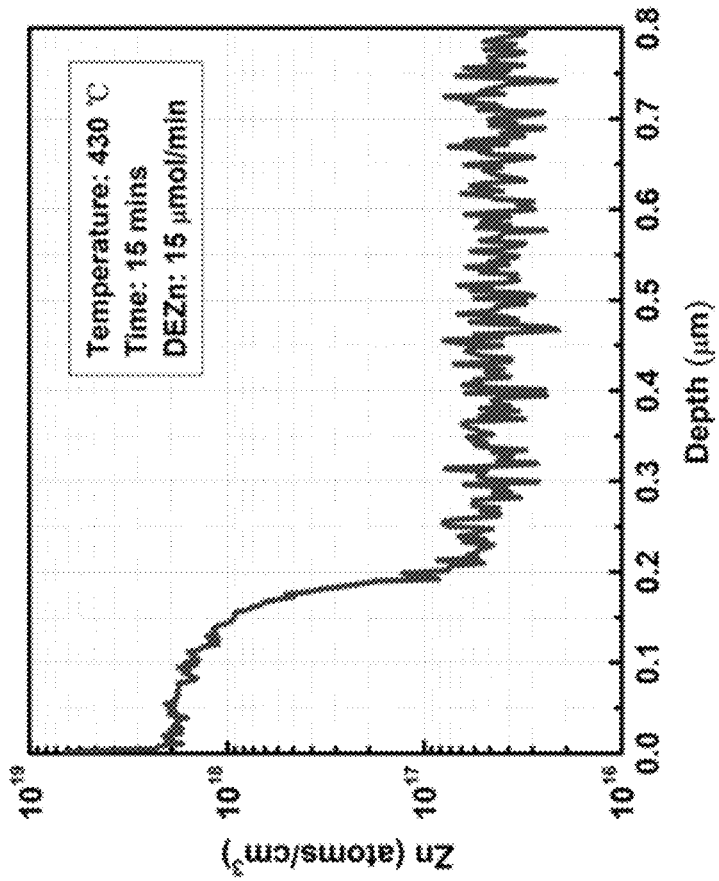
FIG. 6A shows the Zn in-depth profile measured by SIMS for the photodetector of FIG. 5A.

Secondary ion mass spectrometry (SIMS) was used to determine the Zn concentration as well as the location of the Zn diffusion front, which is shown in FIG. 6A. The Zn diffusion profile in InAs/InAs$_{1-x}$Sb$_x$ T2SL exhibited a steep diffusion front. The observed maximum Zn concentration was $2.3 \times 10^{18}$ cm$^{-3}$. It must be noted that this is the total chemical concentration rather than the active carrier concentration because the SIMS measurement is sensitive to the total chemical concentration. The depth of the junction is estimated to be around 0.18 μm, where the Zn concentration is greater than $1 \times 10^{17}$ cm$^{-3}$. Circular transmission line model (CTLM) measurements were performed to investigate the resistivity of the Ti/Au Ohmic contact on the intrinsic n-type region and Zn-diffused p-type region. The CTLM patterns consisted of inner contact pads (r) with a radius of 45 μm and a large, outer contact pad (R) with spacings of 15, 20, 25, 30, 35, 40, and 45 μm from the inner pad. FIG. 6B shows the measured resistance dependence on ln(R/r) of the CTLM patterns on intrinsic and Zn diffused InAs/InAs$_{1-x}$Sb$_x$ superlattices. According to the CTLM model, the specific contact resistance can be obtained from the intercept and slope of the curve shown in FIG. 6B The calculated specific contact resistances were $2.01 \times 10^{-4}$ Ωcm² and $3.78 \times 10^{-4}$ Ωcm² for the intrinsic and Zn-diffused InAs/InAs$_{1-x}$Sb$_x$ superlattices, respectively.

FIG. 7A shows the measured temperature dependent current-voltage (I-V) characteristics of the device with a diameter of 320 μm. At 77 K, the device shows a dark current density of $9.6 \times 10^{-8}$ A/cm² under an applied bias of −20 mV, while at T=150 K, the dark current density at −20 mV is $9.1 \times 10^{-6}$ A/cm². The differential resistance area products at zero bias (R$_0$A) at 77 and 150 K are $3.2 \times 10^5$ and $1.2 \times 10^3$ Ωcm², respectively. The dark current density at 150 K is 36 times lower than the reported value of $3.3 \times 10^{-4}$ A/cm² for MOCVD grown mesa etched multiwafer infrared (MWIR) InAs/InAs$_{1-x}$Sb$_x$ T2SL photodiodes that have a similar superlattice design. (See D. Wu et al., Appl. Phys. Lett. 114, 011104 (2019).) FIG. 7B shows the values of R$_0$A as a function of temperature. This indicates that the dark current is dominated by different mechanisms in different temperature regimes. From 77 to 120 K, the activation energy of 21 meV indicates that the device performance is limited by the temperature-insensitive defect-related leakage. From 120 to 140 K, the dominant mechanism starts to become generation recombination with an activation energy of 190 meV. Above 140 K, the detector is diffusion limited with an activation energy of 310 meV. The activation energy is 50 meV higher than the expected bandgap (260 meV) of the InAs/InAs$_{1-x}$Sb$_x$ T2SL at 150 K, which can be explained by the Burstein-Moss effect due to the high intrinsic doping concentration in the absorber region.

Figure 8:
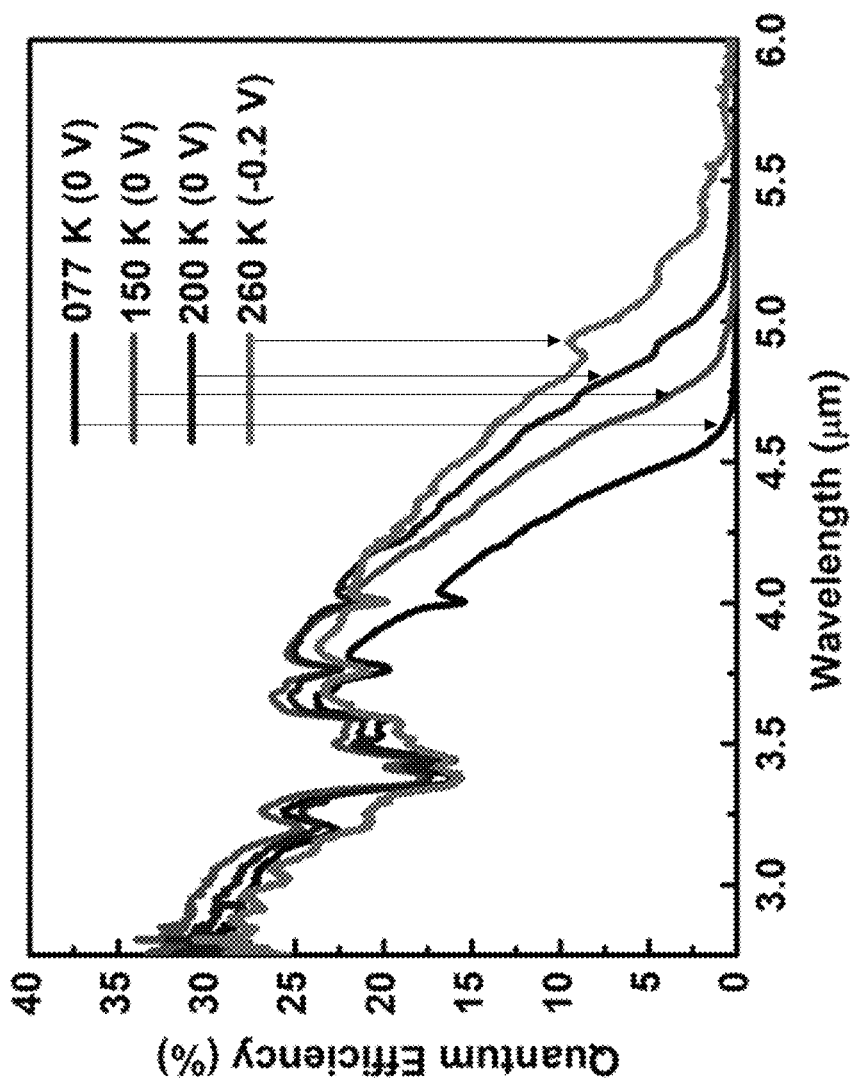
FIG. 8 shows the quantum efficiency spectra of the Zn-diffused photodetector of FIG. 5A at different temperatures.

FIG. 8 shows the measured quantum efficiency (QE) of the devices as a function of wavelength at different temperatures. As the temperature increases from 77 to 260 K, the cutoff wavelength of the devices shifts from 4.28 to 4.75 μm. At 77 K, the device exhibits a peak responsivity of 0.70 A/W, corresponding to a QE of 24% at 3.65 μm. At 150 K, the peak responsivity is 0.78 A/W, corresponding to a QE of 25% at 3.84 μm. The QE of the device shows zero bias dependency until the temperature increases above 200K. At high temperature, the QE can be recovered to the low temperature value with a small applied bias. It is believed that this is caused by the decreased diffusion length at high temperature.

Figure 9:
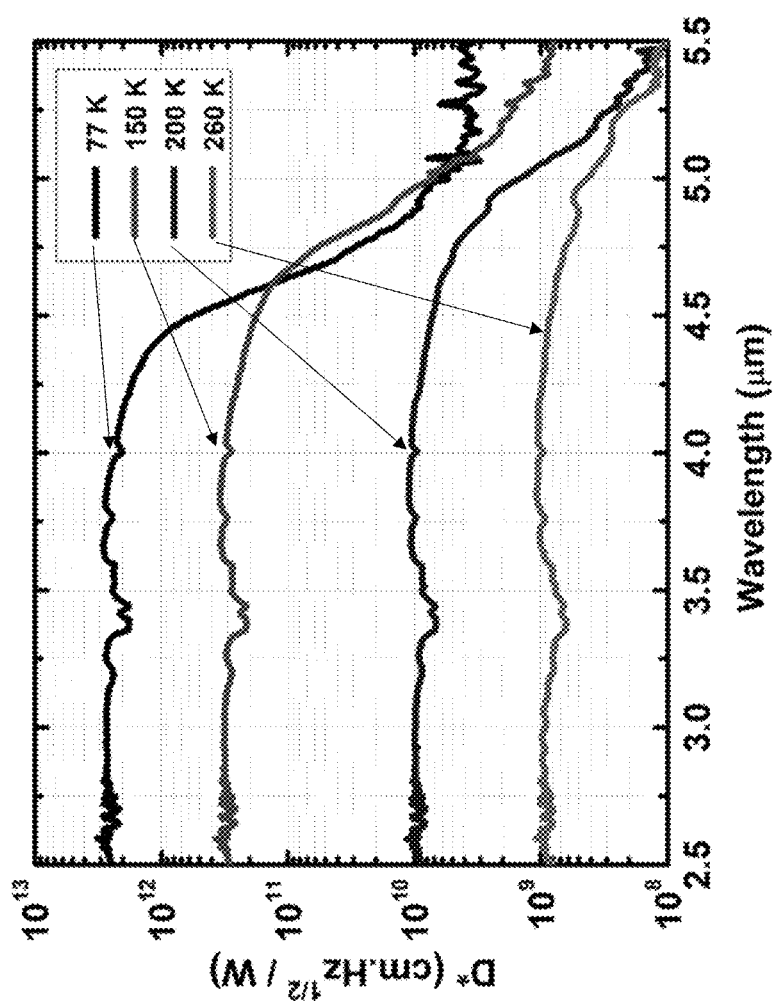
FIG. 9 shows the specific detectivity (D*) spectra of the Zn-diffused photodetector of FIG. 5A at different temperatures.

The specific detectivity D* was estimated using the following equation:

$$D^* = R_i \left[ 2qJ + \frac{4k_bT}{R \times A} \right]^{-1/2}$$

where q is the electronic charge, $k_b$ is Boltzmann's constant, J is the dark current density, R×A is the differential resistance area product, $R_i$ is the spectral responsivity, and T is the temperature of the device. FIG. 9 shows the calculated D* spectral at different temperatures. At 77 K, the device exhibits a peak detectivity D* of $2.9 \times 10^{12}$ cmHz$^{1/2}$/W at the peak response wavelength of 3.65 µm. At 150 K, the peak detectivity D* is $3.4 \times 10^{11}$ cmHz$^{1/2}$/W. The specific detectivity at 150K is nearly three times higher than the reported value of $1.2 \times 10^{11}$ cmHz$^{1/2}$/W from conventional mesa etched MWIR InAs/InAs$_{1-x}$Sb$_x$ T2SL photodiodes grown by MOCVD.

In summary, a Zn-diffused planar mid-wavelength infrared photodetector based on type-II InAs/InAs$_{1-x}$Sb$_x$ superlattices is reported. Both the superlattice growth and Zn diffusion were performed in a metal-organic chemical vapor deposition system. At 77 K, the diffused photodetector exhibits a peak responsivity of 0.70 A/W at 3.65 µm, corresponding to a quantum efficiency of 24% at zero bias without anti reflection coating, with a 50% cutoff wavelength of 4.28 µm. With an $R_0A$ value of $3.2 \times 10^5$ Ωcm$^2$ and a dark current density of $9.6 \times 10^{-8}$ A/cm$^2$ under an applied bias of −20 mV at 77 K, the photodetector exhibits a specific detectivity of $2.9 \times 10^{12}$ cmHz$^{1/2}$/W. At 150 K, the photodetector exhibits a dark current density of $9.1 \times 10^{-6}$ A/cm$^2$ and a quantum efficiency of 25%, resulting in a detectivity of $3.4 \times 10^{11}$ cmHz$^{1/2}$/W. Table 1, below shows the performance comparison of the Zn-diffused planar MWIR InAs/InAs$_{1-x}$Sb$_x$ T2SL photodetector (this work) with the mesa etched photodetector grown by MOCVD at 150 K.

TABLE 1

Performance comparison of the Zn-diffused planar MWIR InAs/InAs$_{1-x}$Sb$_x$ T2SL photodetector (this Example) with the mesa etched photodetector grown by MOCVD at 150 K.

| | Cutoff wavelength (µm) | Dark current density (A/cm$^2$) | Specific detectivity (cmHz$^{1/2}$/W) |
|---|---|---|---|
| This Example | 4.5 | $9.1 \times 10^{-6}$ | $3.4 \times 10^{11}$ |
| Mesa etched InAs/InAs$_{1-x}$Sb$_x$ T2SL | 5.0 | $3.3 \times 10^{-4}$ | $1.2 \times 10^{11}$ |

Example 3

This Example describes the fabrication of a planar T2SL based heterostructure MWIR photodetector using ion-implantation for photodetector isolation. The structure is an nBn InAs/InAs$_{1-x}$Sb$_x$ superlattice photodetector and zinc was chosen as the ion to be implanted to create the isolation between the diodes; zinc has the advantage of being a p-type dopant in this material and will help to counteract the n-type doping of the as-grown nBn structure. The electrical and optical performance of the device was characterized and a comparison with a mesa etched device was made to give deeper understanding of the device performance tradeoffs involved in this approach.

The material was grown on a low Te-doped n-type GaSb (100) substrate using a solid source molecular beam epitaxy (SS-MBE) reactor equipped with valved cracking sources for group-V and SUMO cells for group-III. The growth was started with a 500 nm thick n-doped ($10^{18}$ cm$^{-3}$) InAsSb buffer layer. The nBn structure begins with a 500 nm thick n-doped ($10^{18}$ cm$^{-3}$) bottom contact layer followed by a 2.0 µm thick unintentionally doped MWIR absorption layer ($5-9 \times 10^{15}$ cm$^{-3}$, n-doped). The MWIR absorption layer was chosen to have 10/2 mono-layers (MLs) of the InAs/InAs$_{0.5}$Sb$_{0.5}$ superlattice. Next was a 150 nm thick electron barrier consisting of a superlattice with 4/4 MLs of AlAs$_{0.5}$Sb$_{0.5}$/InAs$_{0.5}$Sb$_{0.5}$ per period (~$1 \times 10^{15}$ cm$^{-3}$, n-doped). This nBn device design was chosen to benefit from reduced generation-recombination currents due to depletion region dropping most of its electric field across the wide bandgap barrier. The AlAs$_{0.5}$Sb$_{0.5}$/InAs$_{0.5}$Sb$_{0.5}$ superlattice has a deep electron quantum well and is an effective wide-bandgap electron barrier for nBn structures. Finally, a 30 nm thick n-doped top contact layer was grown. The top and bottom contacts share the same superlattice design as the absorption layer. Silicon was used as the n-type dopant.

After growth and material quality assessment, top metal contacts (Ti/Au/Ti) were first lithographically patterned on top of the wafers. Depositing the contacts before ion-implantation allows us to deposit the contacts directly on the as-grown surface. A hard-mask (protection layer) consisting of 800 nm of plasma enhanced chemical vapor deposition (PECVD) deposited Sift was then patterned to define the isolation regions between diodes that will be ion-implanted. PECVD is able to produce a highly uniform and low pinhole density hard-mask, which is desirable for ion-implantation. A thickness of 800 nm was chosen based on simulation of the stopping range of ions in matter (SRIM) software, in order to protect the top metal contact and device active region during implantation. For patterning the hard mask standard UV photolithography was performed on T2SL samples and followed by CF4:Ar$^+$ plasma dry etching in an electron cyclotron resonance-reactive ion etching (ECR-RIE) system. The photodetectors (FIGS. 10A-10C) were circular with diameters ranging from 100 µm to 400 µm.

The same SRIM simulation tool was used to estimate the energy and dose required for proper isolation. However, due to complexities of the T2SL structure and lack of empirical data, it is hard to accurately predict the ion-implantation profile. To better understand the best conditions, different ion-implantations were performed with a range of different doses and energies. This was performed by Innovion Corporation with typical ion flux, a substrate tilt of 7° and without substrate cooling. The ion-implantation energy ($E_{imp}$) was either 300, 190, or 100 KeV, and implantation doses of $1.0 \times 10^{15}$, $5.0 \times 10^{14}$, $1.0 \times 10^{14}$ cm$^{-2}$ were used. Zinc was used as the implantation ion because it is a p-type impurity in the T2SL material that can compensate the n-type doping and it has a heavy enough mass to also damage the superlattice thereby enhancing the isolation. The heavier implantation ions have higher carrier removal rates, destructibility and higher thermal stability than lighter ions.

After implantation, all samples were annealed for 15 seconds at 300° C. via rapid thermal annealing (RTA). Then, windows were opened in the hard mask using ECR-RIE and CF4:Ar$^+$ plasma dry etching to expose the top metal contact. As a baseline, a standard mesa-isolated photodiode was also processed from the same wafer. (A. Dehzangi, et al., *Scientific Reports*, vol. 9, no. 1, p. 5003, 2019/03/21, doi: 10.1038/s41598-019-41494-6.) After the fabrication of planar and mesa etched T2SL devices, all samples were diced and wire-bonded to 68-pin leadless ceramic chip carriers (LCCCs) for loading into a cryostat for optical and electrical measurements.

Figures 11A, 11B:
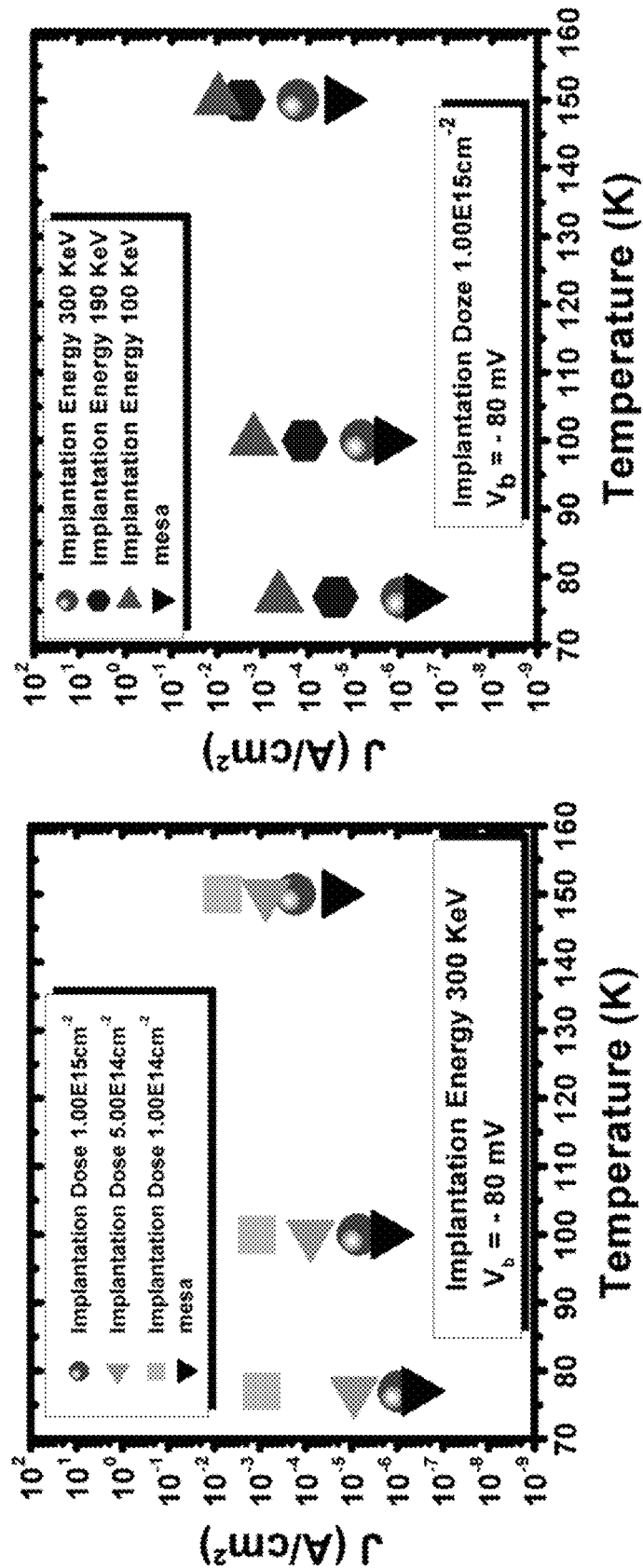
FIG. 11A shows J values vs. temperature for the planar MWIR T2SL photodetectors processed according to illustrative embodiments of the present methods using different implantation doses with $E_{imp}$=300 KeV.
FIG. 11B shows J values vs. temperature of the planar T2SL photodetectors processed according to illustrative embodiments of the present methods using different $E_{imp}$ with the implantation dose of $1.0 \times 10^{15}$ cm$^{-2}$. All diodes were circular with a 160 μm diameter and $V_b$=−80 mV.

The dark current density (J) of the planar T2SL device with different ion-implantation conditions was measured and compared to the traditional mesa-isolated devices. The J values versus temperature under −80 mV applied bias ($V_b$)

are demonstrated in FIG. 11A for different implantation doses and in FIG. 11B for different $E_{imp}$.

By increasing the $E_{imp}$ to higher values (FIG. 11B), the dark current density is decreased, and the same effect occurs for increasing implantation doses (FIG. 11A). The best electrical performance was achieved for the device processed with an implantation energy of 300 KeV and a dose of $1.00\times10^{15}$ cm$^{-2}$. At higher $E_{imp}$ each impinging ion can remove many charge carriers and generate more concentrated damage to the structure. Also, at the higher energy the implanting ions are going deeper and causing more effective isolation. The dose dependence is also a critical parameter, and increasing the ion dose has nearly the same effect on the isolation as using higher energy ions to create more damage. The dose and energy must be above some threshold to effectively create isolation regions; however, they cannot be too high, or damage-related conduction effects or hopping conduction effects could take place. Therefore, the implantation energy and dose need to be optimized accordingly.

Based on the SRIM simulations for the optimized condition ($E_{imp}$=300 KeV/dose=$1.0\times10^{15}$ cm$^{-2}$), the depth of ion concentration peak inside the T2SL material was estimated to be 900 nm with the straggling of 100 nm.

The temperature dependent operation of the optimized planar devices was investigated for the 160 µm diameter circle device and compared with same size mesa etched photodetector. At 77 K the device shows the dark current density of $1.23\times10^{-6}$ A/cm$^2$ at an applied bias ($V_b$) of −80 mV, while at T=100 K and 150 K, the dark current density at $V_b$=−80 mV is $9.12\times10^{-6}$ A/cm$^2$ and $1.42\times10^{-4}$ A/cm$^2$ respectively (FIG. 12A). The differential resistance area product at zero bias ($R_0\times A$) shows two clear regimes as it varies as a function of temperature (FIG. 12B). This indicates that the dark current is dominated by different mechanisms in different temperature regimes. Above 110 K, the detector is diffusion limited with an activation energy of 285 meV. This activation energy is very close to the expected bandgap of the InAs/InAs$_{1-x}$Sb$_x$ superlattice at 150 K. From 110 to 77 K, the dominant mechanism starts to become generation-recombination with activation energy of 127 meV.

The temperature dependent dark current density at $V_b$=−80 mV of the optimized planar device was compared to that of the traditional mesa-isolated device. At a lower temperature, such as 77 K or 100 K, the dark current density of the planar devices is comparable to that of the mesa-isolated device. However, at higher temperatures, such as 150 K, the planar device has almost one order of magnitude greater dark current, which is not desirable. The degraded high temperature operation of the planar device is probably related to the nature of the defects created by the ion-implantation process and annealing treatment.

For optical characterization, either a calibrated 1000° C. blackbody source or a Fourier transform infrared (FTIR) spectrometer (Bruker IFS 66 v/S) were used to top illuminate the devices. No anti-refection (AR) coatings were used. The best performing electrical device ($E_{imp}$=300 KeV/dose of $1.00\times10^{15}$ cm$^{-2}$) also had the best optical performance. The QE of the devices, both at 77 and 150 K, saturates at $V_b$=−80 mV.

Figures 13A, 13B:
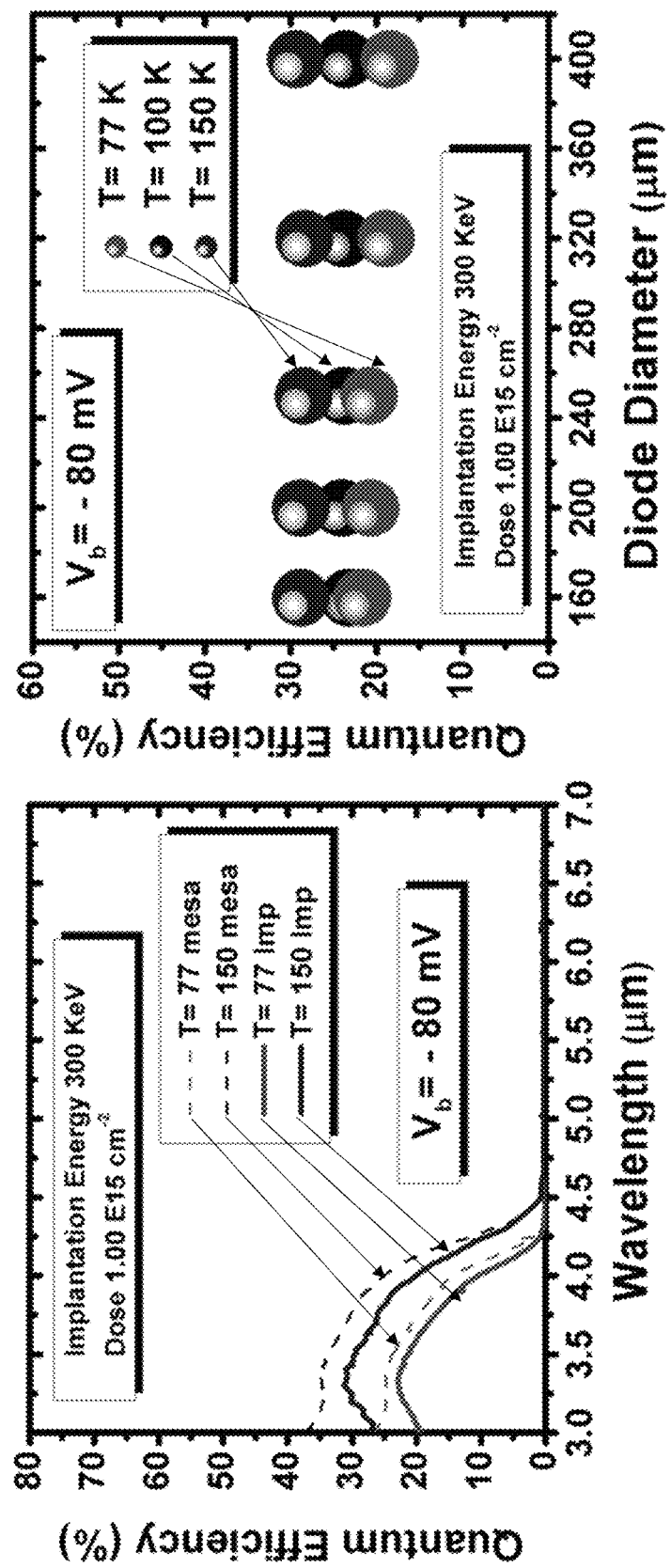
FIG. 13A shows saturated 77 and 150 K QE spectra measured for planar (present methods) and comparative mesa etched MWIR T2SL photodetectors (diode with 160 μm diameter).
FIG. 13B shows saturated QE values for 77, 100, and 150 K for different diameter diodes at 3.35 μm and $V_b$=−80 mV.

FIG. 13A shows the measured quantum efficiency (QE) of the planar MWIR T2SL and mesa etched devices versus wavelength at different temperatures. At 77 K, the 100% cut-off wavelength of the optimized device was 4.28 µm with a saturated peak responsivity of 0.67 A/W, corresponding to a QE of 23.5% at 3.35 µm. At 150 K, the saturated peak responsivity is 0.84 A/W, with the QE of 31.5% at 3.35 µm. These QEs are only slightly lower than those for the mesa-isolated diodes (FIG. 13A and Table 2).

TABLE 2

Comparison of the QE values between mesa etched and planar T2SL devices at λ = 3.35 µm and $V_b$ = −80 mV.

| Device | QE @ 150 K | QE @ 77 K |
| --- | --- | --- |
| Mesa | 36.4% | 25.0% |
| Planar | 31.5% | 23.5% |

Figures 14A, 14B:
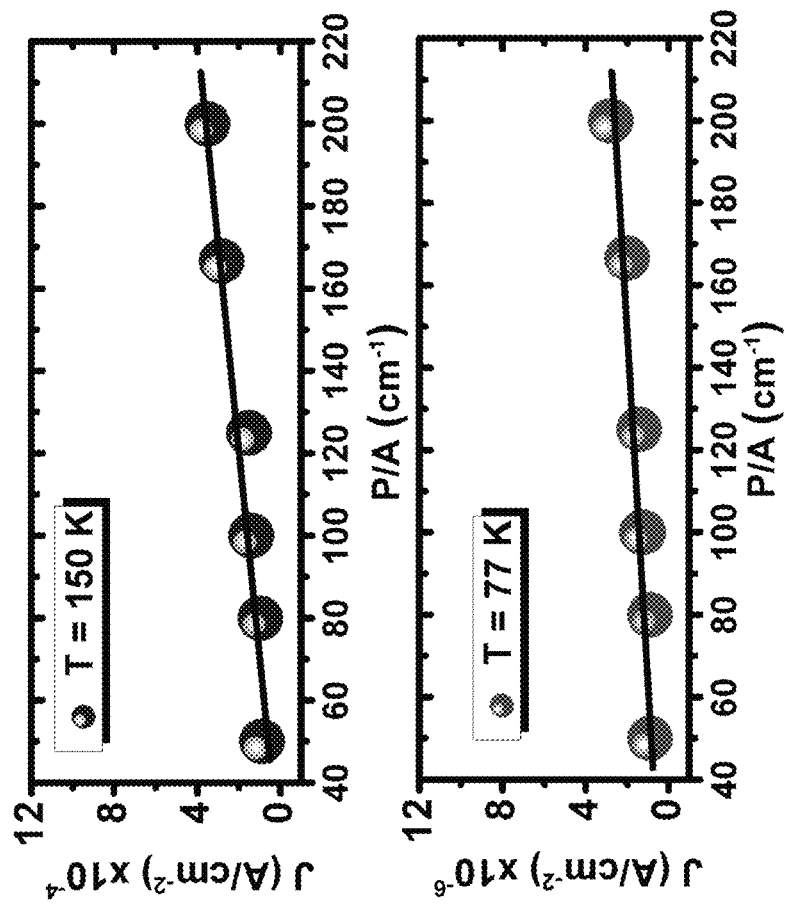
FIGS. 14A-14B show dark current density versus perimeter/area ratio (P/A) under $V_b$=−80 mV at (FIG. 14A) 150K and (FIG. 14B) 77 K.

In order to better understand the scalability of these planar devices and ensure the ion-implantation is fully isolating the diodes, optical and electrical characterization were performed for different sized diodes. At all operating temperatures, the QE values are quite similar across a broad range of different sized diodes (FIG. 13B). The dark current density does not vary strongly with the perimeter/area ratio (P/A) across a wide range of device sizes and only varies slightly at either 77 K or 150K (FIGS. 14A, 14B). This suggests the electrical contribution from the ion-implanted perimeter of the device is minimal. While the smallest device available for testing was 100 µm in diameter (P/A=200 cm$^{-1}$), the available data demonstrate that this technique will continue to scale to significantly smaller sizes, including for FPA application with pixel pitches of 10-30 µm.

Figures 15A, 15B:
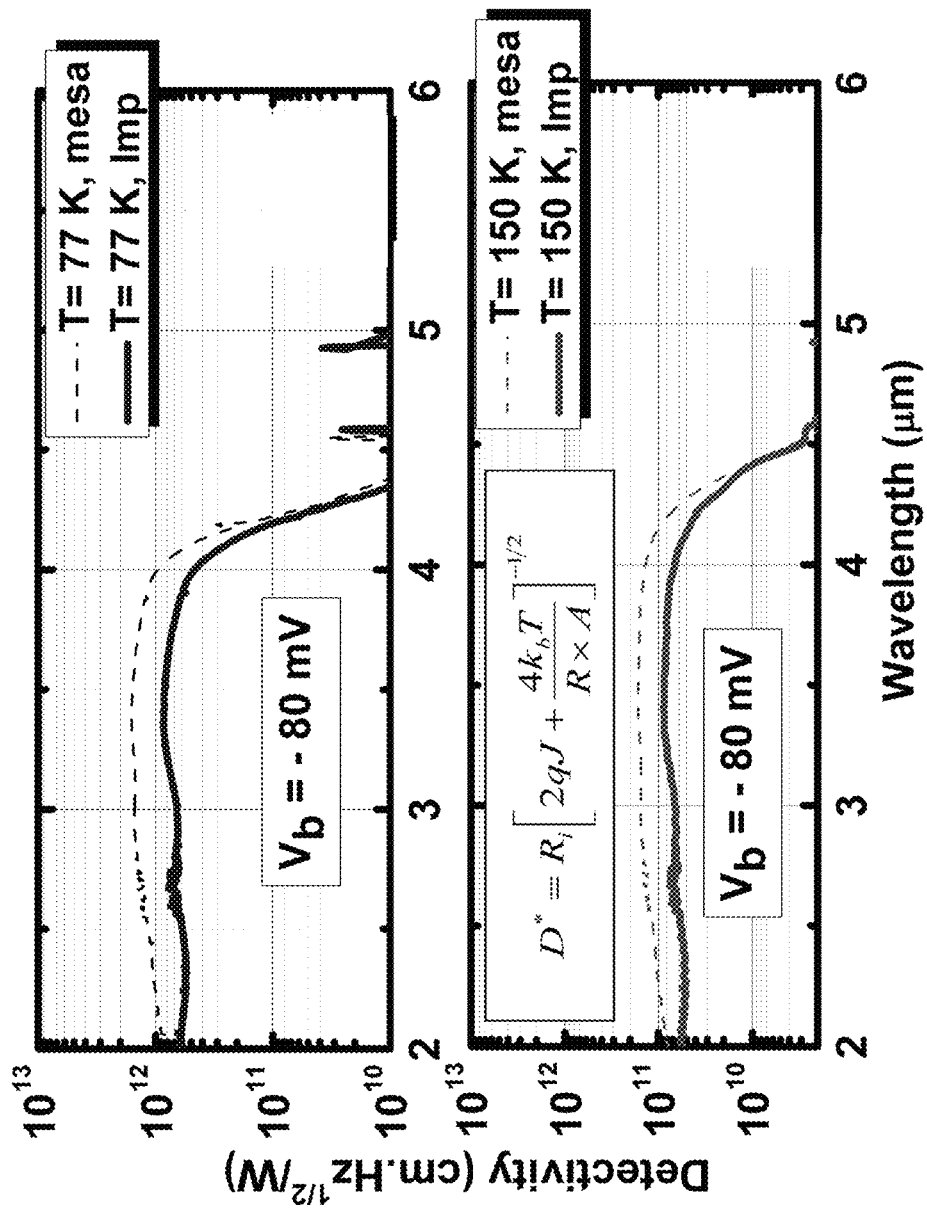
FIGS. 15A-15B show specific detectivity (D*) spectra for planar (present methods) and existing mesa-isolated MWIR T2SL photodetectors at (FIG. 15B) 77 K and (FIG. 15A) 150 K. The D* is calculated based on the equation in the inset, where $k_b$ is the Boltzmann constant, T is the operating temperature, $R_i$ is the responsivity, J is the dark current, and $R \times A$ is the resistance area product. Diodes are circular with a 160 μm diameter

In order to further understand the device performance, the specific detectivity (D*) of the optimized photodetector (implantation energy of 300 KeV and dose of $1.00\times10^{15}$ cm$^{-2}$) was calculated and compared with the mesa etched device. For a 2π FOV at 150 K, at 3.35 µm the 160 µm diameter optimized planar device had a D* value of ~$8.54\times10^{10}$ cmHz$^{1/2}$/W compared to ~$1.86\times10^{11}$ cmHz$^{1/2}$/W for the mesa-isolated device (FIG. 15A). At 77 K the D* values are even closer with $9.12\times10^{11}$ cmHz$^{1/2}$/W for planar device and ~$1.52\times10^{12}$ cmHz$^{-1/2}$/W for the mesa-isolated device (FIG. 15B).

In summary, a zinc ion-implanted planar nBn MWIR photodetector based on type-II InAs/InAs$_{1-x}$Sb$_x$ superlattice is reported. Several implanting energy and doses were implemented, and overall ion-implantation was found to be a viable way of fabricating these devices. For the optimized implantation energy of 300 KeV and dose of $1.00\times10^{15}$ cm$^{-2}$, at 77 K, the dark current density at $V_b$=−80 mV was $1.23\times10^{-6}$ A/cm$^2$ and $R_0\times A$ was $1.53\times10^4 \Omega$cm$^2$. At 77 K and under $V_b$=−80 mV, the planar photodetector exhibits a peak responsivity of 0.67 A/W at 3.35 µm, corresponding to a quantum efficiency of 23.5%, without anti-reflection coating. This corresponds to a D* of $9.12\times10^{11}$ cmHz$^{1/2}$/W. At 150 K, the photodetector exhibits a higher dark current density of $1.42\times10^{-4}$ A/cm$^2$ and a QE of 31.5%, resulting in a D* of $8.54\times10^{10}$ cmHz$^{1/2}$/W. The results demonstrate that planar approach for MWIR T2SL devices is comparable with the mesa-isolated etched approach, and will scale down well to pixel size for FPAs.

Example 4

This Example discloses the demonstration of a pBn MWIR planar type-II superlattice (PT2SL) photodetectors using silicon ion-implantation for device isolation. The photodetector is based on an InAs/InAs$_{1-x}$Sb$_x$ superlattice-based pBn heterostructure. Silicon as the implanted ion can generate the isolation region between each adjacent photodetectors. As an n-type dopant, silicon neutralizes the doping of the top p-type contact layer of the pBn structure. Heavier ions like silicon have higher carrier removal rates, destructibility, and higher thermal stability than lighter ions. Silicon will damage the delicate lattice structure of the T2SL, thereby helping to enhance the isolation.

The epitaxial growth was performed on Te-doped n-type GaSb (100) substrate using a solid source molecular beam epitaxy (SSMBE) reactor. For the structure of the PT2SL photodetector barrier design was chosen. Instead of a more traditional nBn detector which requires higher bias to operate, a pBn detector was chosen. The growth was started with a 500 nm thick n-doped ($10^{18}$ cm$^{-3}$) InAsSb buffer layer, a 500 nm thick n-doped ($10^{18}$ cm$^{-3}$) bottom contact layer, and then followed by a 2.0 μm thick un-intentionally doped MWIR absorption layer. The MWIR absorption layer was designed with a superlattice consisting of 10/2 monolayers (MLs) of InAs/InAs$_{0.5}$Sb$_{0.5}$. Next was the 500 nm thick electron barrier layer consisting of a superlattice with 4/4 MLs of AlAs$_{0.5}$Sb$_{0.5}$/InAs$_{0.5}$Sb$_{0.5}$. This AlAsSb/InAsSb superlattice was chosen for the barrier since it has a deep electron quantum well to act as an effective wide-bandgap electron barrier. Finally, a 350 nm thick p-doped top contact layer was grown. The top and bottom contacts share the same MWIR superlattice design as the absorption layer. Silicon was used as the n-type dopant and Beryllium as the p-type dopant.

After the growth and verification of the material quality, top ohmic-metal contacts (Ti/Au/Ti) were lithographically patterned on top of the wafer. Prior to implantation a hard mask was patterned on the surface of the samples to define the isolation regions between actual diodes. A 1.2 μm thick SiO$_2$ hard-mask was then deposited by plasma enhanced chemical vapor deposition (PECVD) using a plasma of SiH$_4$ and N$_2$O gases (FIG. 16A). The hard-mask was then lithographically patterned using CF4:Ar$^+$ plasma dry etching in an electron cyclotron resonance-reactive ion etching (ECR-RIE) system (FIG. 16B). This SiO$_2$ hard-mask is able to completely block the implanted ions from reaching the device active region and top metal contact, as determined using simulation with the stopping range of ions in matter (SRIM) software. The resulting photodetectors (FIGS. 16A-16E) are circular with diameters ranging from 100 μm to 400 μm.

The wafer was then cut into individual test-pieces that were ion-implanted by Innovion Corporation with typical ion flux, a substrate tilt of 7°, and without substrate cooling. The same SRIM simulation tool was also used to estimate the implantation energy and dose required to generate isolation regions. However, due to the complexities of superlattice materials and the lack of empirical data for T2SL in SRIM, it is challenging to accurately predict the ion-implantation profile. With silicon as the implanting ion, three different ion-implantation energies ($I_{Eng}$) of 380, 190, and 100 KeV were used and each implantation was performed on different pieces with ion-implantation doses ($I_{Dose}$) of $1.0 \times 10^{15}$, $5.0 \times 10^{14}$, and $1.0 \times 10^{14}$ cm$^{-2}$, for a total of 9 permutations. A schematic diagram of the device structure and the area of ion-implantation are shown in FIG. 16E.

After implantation, windows were opened in the hard mask to expose the top metal contact using ECR-RIE plasma dry etching (FIG. 16C); devices were then wire-bonded (FIG. 16D) to a 68-pin leadless chip carrier. No annealing or other post-implantation thermal treatment was performed. In order to give meaningful comparison, a standard mesa-isolated photodiode was also processed from the same wafer using a mesa-isolated photodiode fabrication process. (A. Dehzangi, et al., *Scientific Reports*, vol. 9, no. 1, p. 5003, 2019.) After the fabrication, the planar and mesa-isolated T2SL devices were loaded into a cryostat and tested optically and electrically.

Figures 17A, 17B:
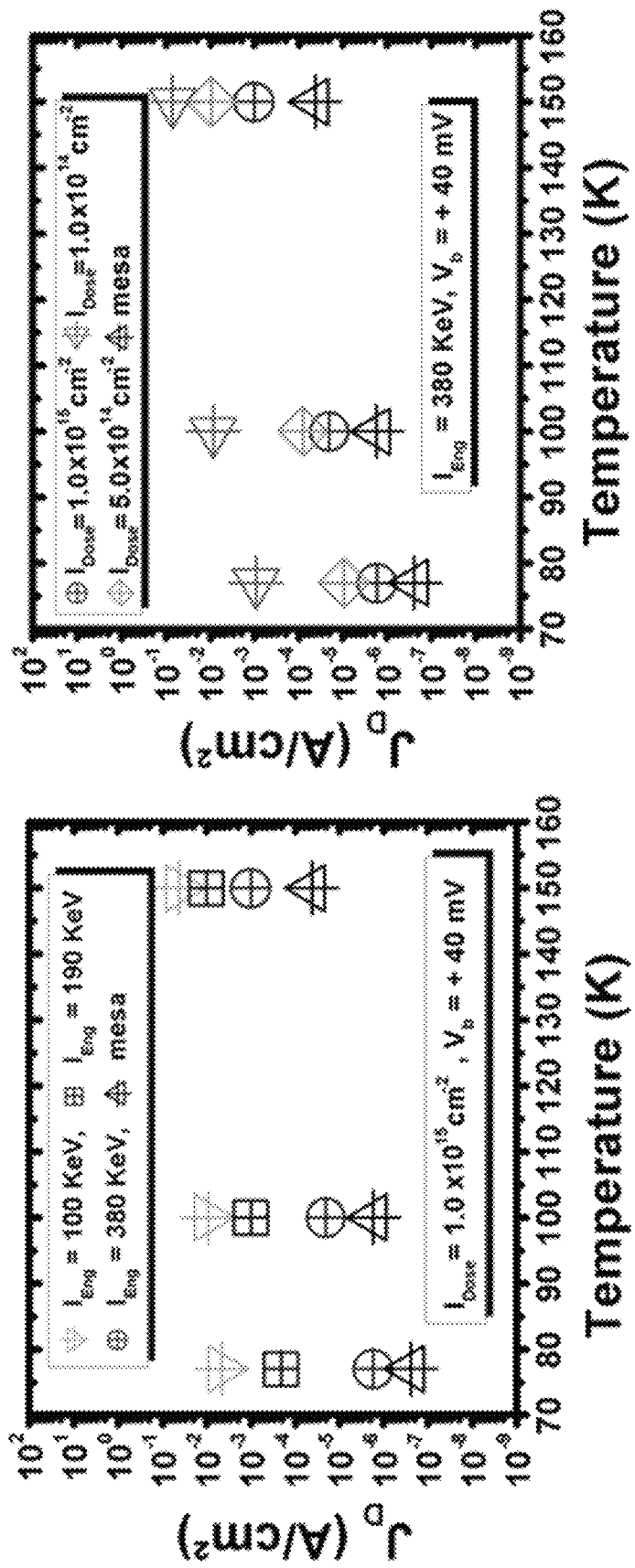
FIG. 17A shows $J_D$ values vs. temperature for MWIR planar T2SL photodetectors according to illustrative embodiments of the present methods using $I_{Eng}$ of 380 KeV and different $I_{Dose}$.
FIG. 17B shows $J_D$ values vs. temperature using $I_{Dose}$=$1.0 \times 10^{15}$ cm$^{-2}$ and different $I_{Eng}$. All diodes were circular with a 200 μm diameter and the applied bias ($V_b$) is +40 mV

The dark current densities ($J_D$) of the PT2SL devices with different ion-implantation conditions were measured and compared to the traditional mesa-isolated device for more comprehensive comparison. The dose and energy must be above some threshold to effectively create isolation regions. The $J_D$ values versus temperature under +40 mV applied bias ($V_b$) are demonstrated in FIGS. 17A-17B for different $I_{Dose}$ (FIG. 17B) and different $I_{Eng}$ (FIG. 17A).

Increasing either the $I_{Eng}$ (FIG. 17A) or the $I_{Dose}$ (FIG. 17B) leads to a reduced dark current density. At higher implantation energy each impinging ion can generate more damage to the structure, and they penetrate deeper causing more effective device isolation. At higher $I_{Dose}$ the dark current reduction is due to more ions available to counteract the epitaxial doping and more ions causing more damage to the T2SL. The best electrical performance was achieved with $I_{Eng}$=380 KeV and $I_{Dose}$=$1.0 \times 10^{15}$ cm$^{-2}$. However, even with these conditions the dark current is still slightly higher than that of the reference mesa-isolated device at 77 K. For higher temperature as 150 K the difference is higher. The performance degradation at high temperature operation of the P2TSL device is probably related to the nature of the defects created by the ion-implantation process.

Based on the SRIM simulations for the optimized condition ($I_{Eng}$=380 KeV and $I_{Dose}$=$1.0 \times 10^{15}$ cm$^{-2}$), the depth of the ion concentration peak inside the T2SL material was estimated to be 1 μm with a straggle of 115 nm. This corresponds to ions affecting the entire top p-contact, barrier, and reaching 150 nm into the n-type MWIR absorption region. Increasing the implantation dose and energy further may yield a further reduction of the dark current; however, the energy/dose of bombardment ions cannot be very low or isolation will not be attained, nor can they be unlimitedly high, since damage-related conduction effects or hopping conduction effects could increase the dark current. This risk is borne out by the comparatively larger dark current at high temperature that may be related to the nature of the defects created by the ion-implantation process.

Figures 18A, 18B:
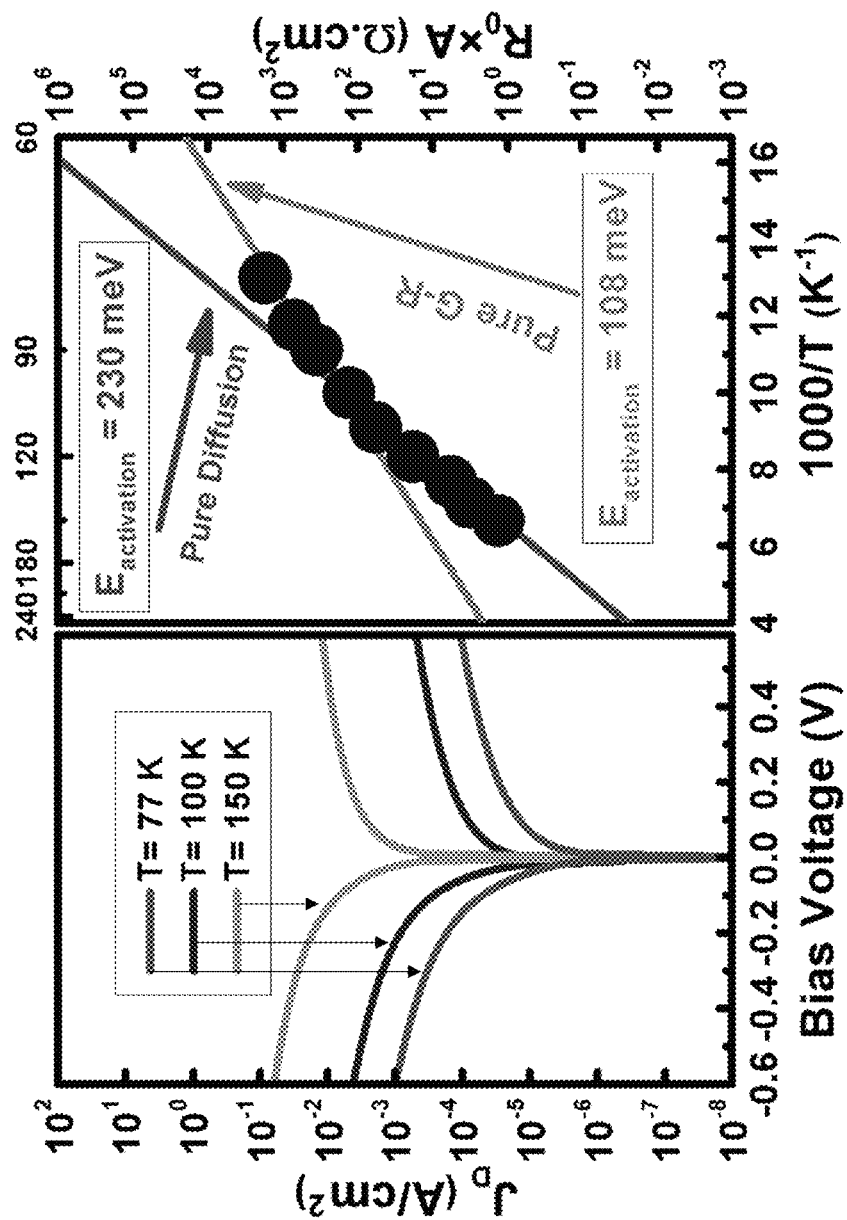
FIG. 18A shows $J_D$ vs. bias voltage at different temperatures for the pBn planar photodetector processed according to illustrative embodiments of the present methods using $I_{Eng}$=380 KeV and $I_{Dose}$=$1.0 \times 10^{15}$ cm$^{-2}$.
FIG. 18B shows an Arrhenius plot of the $R_0 \times A$. Solid lines represent linear fits of the two dominate regimes.

At $V_b$=+40 mV and T=77 K, a 200 μm diameter optimized PT2SL device ($I_{Eng}$=380 KeV and $I_{Dose}$=$1.0 \times 10^{15}$ cm$^{-2}$) shows a $J_D$ of $5.21 \times 10^{-6}$ A/cm$^2$. If the temperature is increased to 100 K the $J_D$ goes to $4.10 \times 10^{-5}$ A/cm$^2$; at 150 K it increases to $2.68 \times 10^{-3}$ A/cm$^2$ (FIG. 18A). An Arrhenius plot of the differential resistance area product at zero bias ($R_0 \times A$) indicates the dark current is dominated by different mechanisms in different temperature regimes (FIG. 18B). Above 100 K, the detector is diffusion limited with an activation energy ($E_{activation}$) of 230 meV; this $E_{activation}$ is very close to the expected bandgap of the MWIR InAs/InAs$_{1-x}$Sb$_x$ superlattices in this temperature regime. From 100 to 77 K, the detector becomes generation-recombination limited with an $E_{activation}$ of 108 meV.

The devices were optically characterized under front-side-illumination using a calibrated 1000° C. blackbody source along with a Fourier transform infrared (FTIR) spectrometer (Bruker IFS 66 v/S). No anti-refection (AR) coatings were applied to the device. The devices can operate unbiased, but can still operate up to +40 mV before saturation (FIG. 19B). At 77 K and +40 mV bias, the 100% cut-off wavelength of the MWIR PT2SL device was 4.6 μm with a peak responsivity of 0.76 A/W at 3.8 μm, corresponding to a quantum efficiency (QE) of 21.5% (FIG. 19A). At 150 K, the peak responsivity increases to 1.09 A/W, corresponding to a QE of 32.6%. These values are only slightly lower (17% lower at 150 k and 12% lower at 77 K) than those of the reference mesa-isolated device (Table 3). It is speculated that this trend could be related to the optical contribution of the sloped mesa sidewalls in acting like mirrors and slightly enhancing the QE of mesa isolated devices.

TABLE 3

Comparison of the QE of the planar and mesa-isolated T2SL devices at 150 and 77 K at λ= 3.8 μm and at the applied bias of +40 mV.

| Device | QE @ 150 K | QE @ 77 K |
|---|---|---|
| Mesa | 39.2% | 24.4% |
| Planar | 32.6% | 21.5% |

In order to ensure the ion-implantation is fully isolating the diodes optical characterization of different size diodes was performed (FIG. 19C). At all operating temperatures, the QE values are similar across a broad range of diode sizes. This indicates that the ion-implantation is effective at defining the device active region and demonstrates that this approach will scale down to pixel size diodes useful for FPA applications.

Figures 20A, 20B:
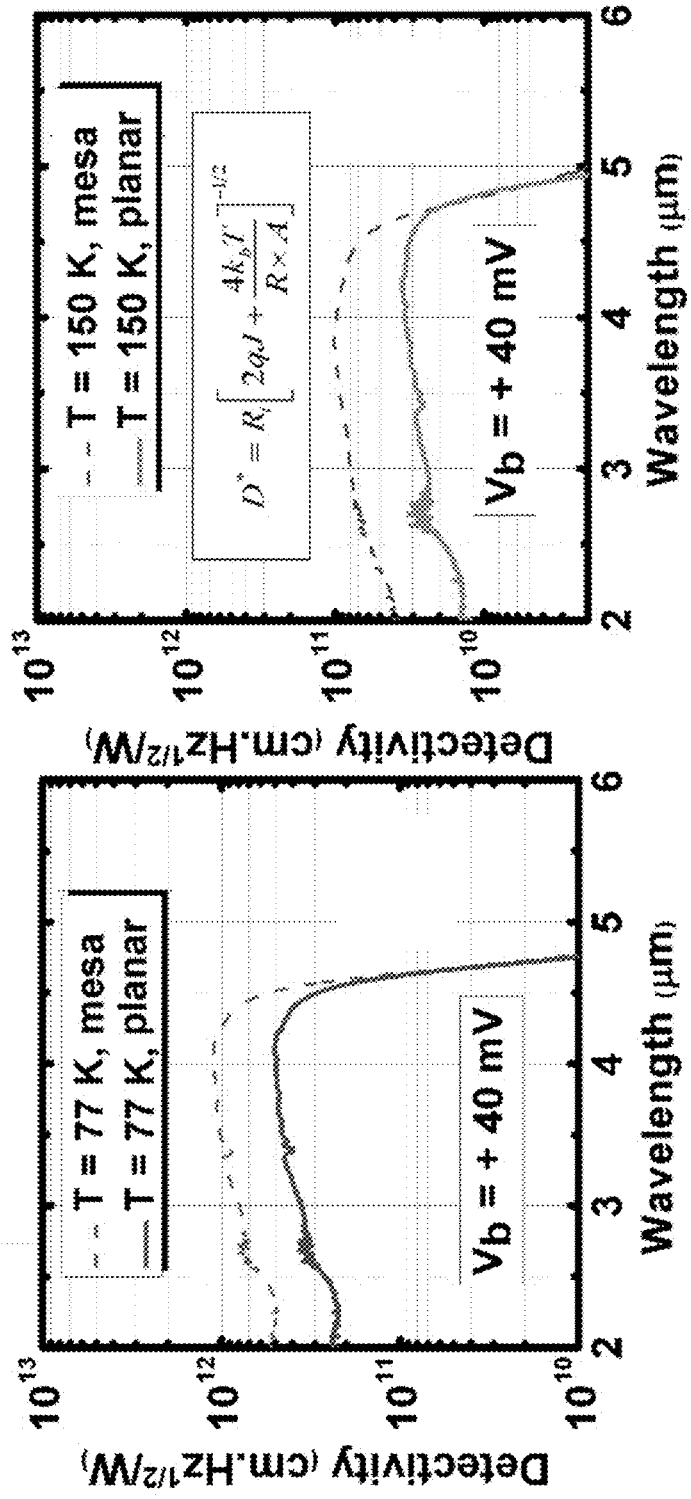
FIGS. 20A-20B show specific detectivity (D*) spectra for the optimized planar ($I_{Eng}$=300 KeV and $I_{dose}$=$1.0 \times 10^{15}$ cm$^{-2}$, present methods) and comparative mesa-isolated MWIR T2SL photodetectors at (FIG. 20A) 77 K and (FIG. 20B) 150 K. Calculation is based on the shot noise limited detectivity equation in the inset where q is the charge of the electron, $k_b$ is Boltzmann's constant, J is the dark current density at the applied bias ($V_b$) of +40 mV, $R \times A$ is the differential resistance area product at $V_b$=+40 mV, $R_i$ is the spectral responsivity and T is the temperature.

In order to estimate the detective performance of these novel planar devices in systems applications, the specific detectivity (D*) was estimated assuming the device is shot noise-limited (FIGS. 20A-20B). At 150 K the planar device has a D* of ~3.37×10$^{10}$ cmHz$^{1/2}$/W at 3.8 μm, compared to ~1.0×10$^{11}$ cmHz$^{1/2}$/W for the mesa-isolated reference device. When the temperature is decreased to 77 K these D* values become even closer, with ~4.95×10$^{11}$ cmHz$^{1/2}$/W for planar device and ~1.10×10$^{12}$ cmHz$^{1/2}$/W for the mesa-isolated device.

In summary, a silicon ion-implanted planar pBn MWIR photodetectors based on type-II InAs/InAs$_{1-x}$Sb$_x$ superlattices is reported. Several ion-implantation energies and doses were studied, and the best performance was obtained with $I_{Eng}$=380 KeV and $I_{Dose}$=1.0×10$^{15}$ cm$^{-2}$. At 77 K, this optimized planar photodetector exhibits a peak responsivity of 0.76 A/W at 3.8 μm, corresponding to a quantum efficiency of 21.5% under $V_b$=+40 mV. With a 77 K dark current density of 5.21×10$^{-6}$ A/cm$^2$ at the same +40 mV of applied bias, the photodetector exhibits a specific detectivity of 4.95×10$^{11}$ cmHz$^{1/2}$/W. At 150 K, the optimized planar device's dark current density increases to 2.68×10$^{-3}$ A/cm$^2$ and a detectivity drops to 3.37×10$^{10}$ cmHz$^{1/2}$/W.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A method for fabricating a planar photodetector, the method comprising:
    removing a portion of a protection layer formed on a surface of a semiconductor heterostructure, the semiconductor heterostructure comprising an n-type or a p-type top contact layer, a barrier layer under the top contact layer, and an absorber layer under the barrier layer, wherein the top contact layer, the barrier layer, and the absorber layer are each a type II superlattice, to define an implantation window in the protection layer through which a portion of the surface of the semiconductor heterostructure is exposed; and
    exposing the portion of the surface of the semiconductor heterostructure to a flux of ions using ion implantation at an implantation energy and an implantation dose sufficient to damage each type II superlattice and remove charge carriers therefrom, thereby forming an isolation region surrounding an unexposed portion of the semiconductor heterostructure.

2. The method of claim 1, further comprising forming the semiconductor heterostructure on a surface of a substrate and forming the protection layer on the surface of the semiconductor heterostructure.

3. The method of claim 1, wherein the top contact layer is n-type and the absorber layer is n-type or the top contact layer is p-type and the absorber layer is n-type.

4. The method of claim 1, wherein the top contact layer and the absorber layer are each selected from an InAs/GaSb type II superlattice and an InAs/InAs$_{1-x}$Sb$_x$ type II superlattice.

5. The method of claim 1, wherein the isolation region extends from the surface of the semiconductor heterostructure through the top contact layer, through the barrier layer, and partially through the absorber layer.

6. The method of claim 1, wherein the planar photodetector is one of an array of planar photodetectors, wherein each planar photodetector in the array is isolated from adjacent planar photodetectors by its isolation region.

7. The method of claim 1, wherein the top contact layer and the absorber layer are each selected from an InAs/GaSb type II superlattice and an InAs/InAs$_{1-x}$Sb$_x$ type II superlattice, and the isolation region extends from the surface of the semiconductor heterostructure through the top contact layer, through the barrier layer, and partially through the absorber layer.

8. The method of claim 7, wherein the method does not comprise annealing the planar photodetector.

9. The method of claim 1, wherein the implantation energy is at least 300 keV and the implantation dose is at least 10$^{15}$ cm$^{-2}$.

10. The method of claim 9, wherein the flux of ions comprises Si ions or Zn ions.

11. The method of claim 10, wherein the semiconductor structure comprises the n-type top contact layer and the n-type top contact layer is an InAs/InAs$_{0.5}$Sb$_{0.5}$ type II superlattice, further wherein the barrier layer is an AlAs$_{0.5}$Sb$_{0.5}$/InAs$_{0.5}$Sb$_{0.5}$ type II superlattice and the absorber layer is an InAs/InAs$_{0.5}$Sb$_{0.5}$ type II superlattice, and further wherein the flux of ions comprises Zn ions.

12. The method of claim 11, wherein the planar photodetector exhibits a quantum efficiency of at least 23.5% at a temperature of 77 K, a wavelength of 3.35 μm, and an applied bias of −80 mV.

13. The method of claim 10, wherein the semiconductor heterostructure comprises the p-type top contact layer and the p-type top contact layer is an InAs/InAs$_{0.5}$Sb$_{0.5}$ type II superlattice, further wherein the barrier layer is an $AlAs_{0.5}Sb_{0.5}/InAs_{0.5}Sb_{0.5}$ type II superlattice and the absorber layer is an $InAs/InAs_{0.5}Sb_{0.5}$ type II superlattice, and further wherein the flux of ions comprises Si ions.

14. The method of claim 13, wherein the planar photodetector exhibits a quantum efficiency of at least 21.5% at a temperature of 77 K, a wavelength of 3.8 μm and an applied bias of 40 mV.

* * * * *